US011280810B2

(12) United States Patent
Balsamo et al.

(10) Patent No.: US 11,280,810 B2
(45) Date of Patent: Mar. 22, 2022

(54) METER APPARATUS FOR MEASURING PARAMETERS OF ELECTRICAL QUANTITY

(71) Applicant: TELECOM ITALIA S.p.A., Milan (IT)

(72) Inventors: Domenico Balsamo, Bologna (IT); Valter Bella, Turin (IT); Fabio Luigi Bellifemine, Turin (IT); Luca Benini, Bologna (IT); Davide Brunelli, Bologna (IT); Clemente Villani, Bologna (IT)

(73) Assignee: TELECOM ITALIA S.p.A., Milan (IT)

( * ) Notice: Subject to any disclaimer, the term of this patent is extended or adjusted under 35 U.S.C. 154(b) by 396 days.

(21) Appl. No.: 16/304,220

(22) PCT Filed: May 31, 2016

(86) PCT No.: PCT/EP2016/062303
§ 371 (c)(1),
(2) Date: Nov. 23, 2018

(87) PCT Pub. No.: WO2017/207037
PCT Pub. Date: Dec. 7, 2017

(65) Prior Publication Data
US 2020/0278383 A1 Sep. 3, 2020

(51) Int. Cl.
*G01R 15/12* (2006.01)
*G01R 15/16* (2006.01)
(Continued)

(52) U.S. Cl.
CPC ............. *G01R 15/12* (2013.01); *G01R 15/16* (2013.01); *G01R 15/18* (2013.01); *G01R 27/2605* (2013.01)

(58) Field of Classification Search
CPC .. G01R 21/006; G01R 15/16; G01R 27/2605; G01R 15/12; G01R 15/18; G01R 25/00;
(Continued)

(56) References Cited

U.S. PATENT DOCUMENTS 5,473,244 A * 12/1995 Libove ..................... G01R 1/22 324/126
2010/0156441 A1 6/2010 Moliton et al.
(Continued)

OTHER PUBLICATIONS

International Search Report and Written Opinion dated Feb. 7, 2017, in PCT/EP2016/062303, filed May 31, 2016.
(Continued)

*Primary Examiner* — Lee E Rodak
*Assistant Examiner* — Brent J Andrews
(74) *Attorney, Agent, or Firm* — Oblon, McClelland, Maier & Neustadt, L.L.P.

(57) ABSTRACT

A meter apparatus is provided for determining parameters of an AC electric signal in first and second wires, the AC signal including an AC electric current and an AC electric voltage, the apparatus including a measurement section to provide first and second measure signals each one indicative of the AC voltage based on a first capacitive coupling with the first wire and on a second capacitive coupling with the second wire, the first and second measure signals depending on capacitance values of the first and second capacitive couplings, and a control unit to determine said capacitance values of the first and second capacitive couplings according to the first and second measure signals, and determining the amplitude of the AC voltage according to the first or second measure signal, and to the capacitance values of the first and second capacitive couplings.

13 Claims, 5 Drawing Sheets

Figure 1:
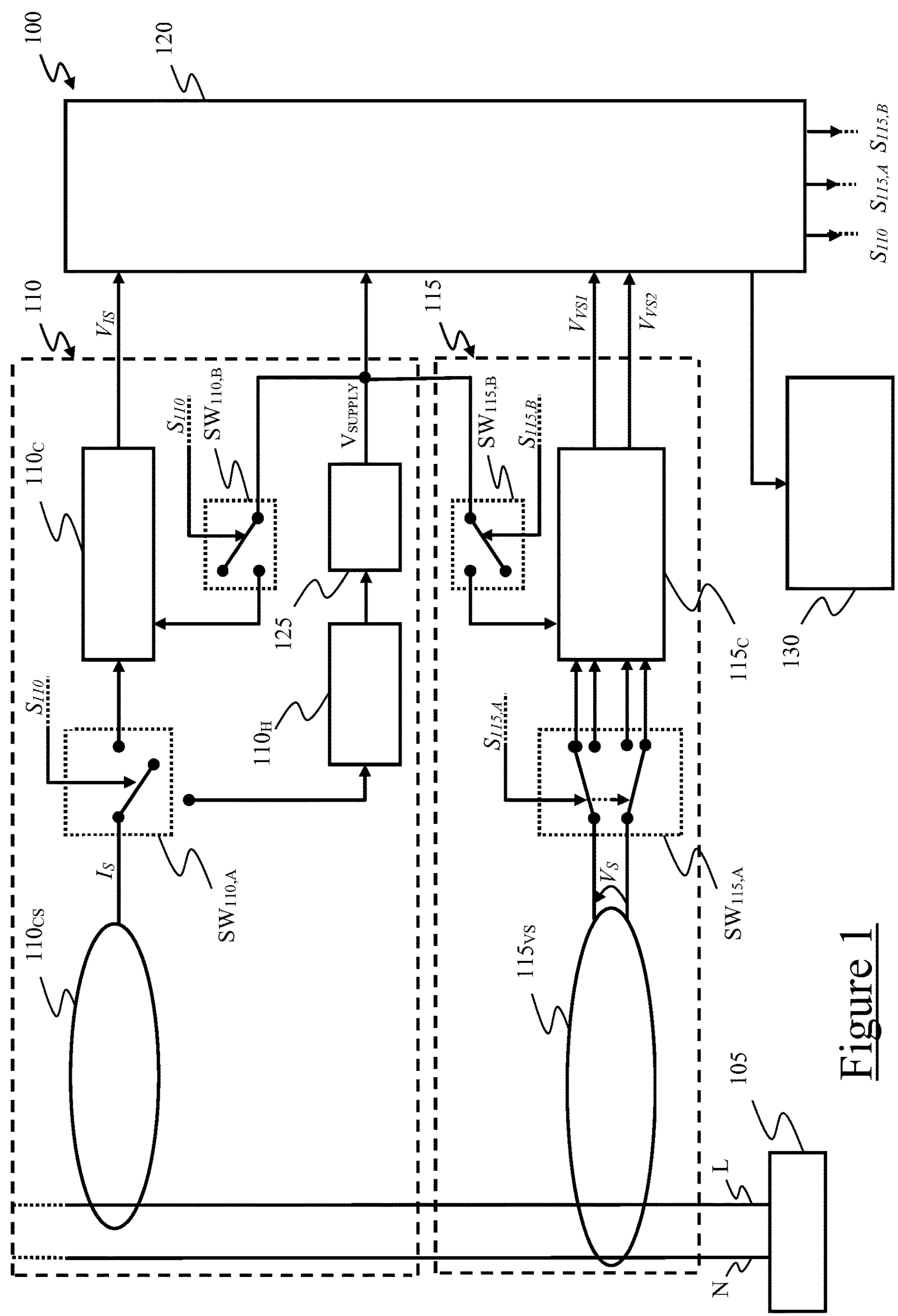

(51) Int. Cl.
*G01R 15/18* (2006.01)
*G01R 27/26* (2006.01)

(58) Field of Classification Search
CPC ...... G01R 22/063; G01R 1/22; G01R 15/142; G01D 4/002
See application file for complete search history.

(56) References Cited

U.S. PATENT DOCUMENTS

2010/0318306 A1* 12/2010 Tierney ................ G01R 22/063
702/62
2016/0061864 A1* 3/2016 White .................. G01R 35/005
324/601

OTHER PUBLICATIONS

Office Action dated Apr. 20. 2021 in corresponding Chinese Patent Application No. 201680087418.8 (with English Translation), 6 pages.

* cited by examiner

METER APPARATUS FOR MEASURING PARAMETERS OF ELECTRICAL QUANTITY

BACKGROUND OF THE INVENTION

Field of the Invention

The present invention generally relates to a meter apparatus for measuring parameters (e.g., amplitude and/or phase shift) of electrical quantities (e.g., electric voltage and/or electric current). In particular, the present invention relates to a meter apparatus for effectively measuring parameters of electrical quantities of any wire in operation without the use of batteries and in a non-intrusive manner.

Overview of the Related Art

In modern society, electric power is critical to daily life. Therefore, measurement of parameters (such as amplitude and/or phase shift) of electrical quantities (such as electric voltage and/or electric current) in wires (such as in line and/or neutral wires) in operation is of the utmost importance for achieving efficient control on power usage of electric loads in residential households and buildings.

For example, determining the amplitude of the electric voltage and of the electric current in line and neutral wires in an electrical distribution system permits to determine harmonic distortion in that electrical distribution system. Harmonic distortion typically affects electric loads (such as personal computers, laser printers, battery chargers, and other small appliances) powered by "Switched-Mode Power Supply" (SMPS) modules, and may cause, inter alia, large load currents in the neutral wire of a three-phase electrical distribution system (which can cause potential fire hazards, as only the line wire is usually protected by circuit breakers), overheating (which may shorten the life of the electronic devices), poor power factor of the electric loads (e.g. power factor lower than 0.9, which could result in monthly utility penalty fees), resonance (which produces over-current surges), false tripping of circuit breakers, and electric load malfunctions.

In order to measure (and monitor) electric load consumption, information sensors, and respective meter apparatuses, have been developed.

Most of the existing solutions of meter apparatuses are substantially based on two approaches, namely a single-sensor approach and a multi-sensor approach.

A meter apparatus based on single-sensor approach allows monitoring an electrical circuit that contains a number of electric loads which switch on and off independently, and makes use of an on-site analysis of the electric current and electric voltage waveforms for estimating the number of electric loads, the nature of each electric load, the energy consumption of each electric load, and other relevant statistics such as time-of-day variations. Although meter apparatuses based on single-sensor approach are easier to deploy, they nevertheless rely on expensive custom hardware, and require either a priori knowledge about the electric loads and their electrical characteristics or a complex training phase involving the user (where the apparatus learns about the specific electrical characteristics of the electric loads). A-priori knowledge is difficult to obtain, and to keep updated, in a modern context of fast changing small appliances, and training procedures discourage users.

A meter apparatus based on multi-sensor approach comprises a current sensor installed in-line with each load (such as a commercially available smart power outlet) for measuring the power consumption at the point where the electric load is placed, or measure point, and a central gateway for gathering (and possibly displaying) the measured power consumption from each electric load.

S. Ahmad, "*Smart metering and home automation solutions for the next decade*" in Proc. of the international conference on Emerging Trends in Networks and Computer Communications, 2011(ETNCC 2011), Apr. 22-24 2011, pp. 200-204, discloses the use of the smart metering and home automation technologies for efficient utilization of energy, thus paving the way for a cleaner and greener environment for future generations. This paper presents an overview on Information and Communications Technology (ICT) used for Smart Metering and Home Automation based on Short distance Radio Frequency (RF) technologies like ZigBee, Z-Wave, Low Power Radio and Distribution Line Carrier (DLC).

F. Cai, E. Farantatos, R. Huang, A. P. Sakis Meliopoulos, J. Papapolymerou, "*Self-powered smart meter with synchronized data*" in Proc. Of the IEEE Radio and Wireless Symposium (RWS 2012), Jan. 15-18 2012, pp. 395-398, discloses a meter apparatus with real-time data detection capability, high reliability, self-powered and with low fabrication cost, intended for use in smart grid applications. Compared with the old local grid, knowing the system status in real time is achieved as a first step to control a smart grid reliably. The proposed framework provides insights about an energy harvesting sensor network to monitor the smart grid's power distribution. This provides the information needed to make a compromise between efficiency and reliability of the whole grid system. The meter apparatus design shown in this document operates automatically and is considered with installation difficulties and environmental effects such as position displacement due to weather, electrical and magnetic field interaction and so on. Each meter apparatus collects current, voltage and associated phase angles and proceed to carry a two-way communication to form a sensors net using which a RF commercial communication module.

U.S. Pat. No. 6,825,649 discloses a measurement method for measuring an AC voltage applied to a conductor, without contacting the conductor, using a detection probe, provided with a detection electrode capable of covering part of a surface of insulation for insulating the conductor and a shield electrode for covering the detection electrode, and an oscillator for outputting a signal having a certain frequency, wherein one end of each of a core wire and a sheath wire of a shield cable are connected to the detection electrode and the shield electrode, and a floating capacitance effect is substantially made zero by establishing an imaginary short-circuit state between each of the other ends. The measurement method comprises the steps of measuring impedance between the detection electrode and the conductor by applying the signal from an oscillator to the detection electrode via the shield cable, measuring a current discharged from the detection electrode attributable to the voltage applied to the conductor, and obtaining the applied voltage based on the measured impedance and current.

SUMMARY OF INVENTION

The Applicant has recognized that none of the cited prior-arts solutions is satisfactory.

The Applicant has found that current meter apparatuses based on multi-sensor approach achieve a consumption breakdown, but need a large number of sensors in the residential environment. This leads to high costs, and discourages their use.

According to the Applicant, in "*Self-powered smart meter with synchronized data*" paper, each meter apparatus is arranged for collecting current, voltage and associated phase angles in an intrusive manner, which makes measurements not fully reliable. Moreover, the Applicant has understood that this paper does not face any issue that affects real measurements, such as wire geometry (which may also significantly differ from a measure point to another one) and wire spatial geometry or arrangement (indeed, a wire at a measure point cannot be approximated as a rectilinear conductor if, for example, it is bent).

The Applicant has noticed that U.S. Pat. No. 6,825,649 only discloses a voltage monitoring, without taking into account parameters relating to phase shift (such as Power Factor). Moreover, the Applicant has understood that U.S. Pat. No. 6,825,649, similarly to the "*Self-powered smart meter with synchronized data*" paper, does not face any issue that affects real measurements, such as wire geometry and wire spatial geometry or arrangement.

In view of the above, the Applicant has faced the issue of determining the electric voltage and/or electric current waveforms (or relevant parameters thereof) of an AC signal in a non-intrusive manner, and independently from wire geometry and from wire spatial geometry or arrangement at the measure point, and, in order to achieve that, has devised a low cost and effective meter apparatus (and method) addressing this issue.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect).

More specifically, an aspect of the present invention relates to a meter apparatus for determining parameters of an AC electric signal in first and second wires, the AC electric signal comprising an AC electric current and an AC electric voltage. The meter apparatus comprises:

a measurement section configured for providing first and second measure signals each one indicative of the AC electric voltage based on a first capacitive coupling with the first wire and on a second capacitive coupling with the second wire, the first and second measure signals depending on capacitance values of the first and second capacitive couplings. The meter apparatus also comprises a control unit configured for:

determining said capacitance values of the first and second capacitive couplings according to the first and second measure signals, and determining the amplitude of the AC electric voltage according to the first or second measure signal, and to the capacitance values of the first and second capacitive couplings.

According to an embodiment of the present invention, the meter apparatus further comprises a further measurement section configured for providing a third measure signal indicative of the AC electric current based on an inductive coupling with the first or second wire. Preferably, the control unit is further configured for:

determining a phase shift between the AC electric voltage and the AC electric current according to a phase shift between the first and third measure signals.

According to an embodiment of the present invention, the meter apparatus further comprises first and second capacitive elements for performing said first and second capacitive couplings. Said first and second capacitive elements preferably comprise at least a portion of said first and second wires.

According to an embodiment of the present invention, said measurement section further comprises first and second input capacitive elements electrically coupleable to the first and second capacitive elements, respectively. Preferably, the first and second capacitive elements and, respectively, the first and second input capacitive elements define, when coupled to each other, an impedance voltage divider for providing said first measure signal from said AC electric voltage, the first measure signal being in phase with respect to said AC electric voltage.

According to an embodiment of the present invention, said measurement section comprises further first and further second capacitive elements electrically coupleable to the first and second capacitive elements, respectively. The first and second capacitive elements and, respectively, the further first and further second capacitive elements preferably define, when coupled to each other, an impedance voltage divider providing said second measure signal from said AC electric voltage, the first and second measure signals being in phase with respect to each other.

According to an embodiment of the present invention, said measurement section comprises first and second circuit arrangements electrically coupleable to the first and second capacitive elements, respectively. The first and second capacitive elements and, respectively, the first and second circuit arrangements preferably define, when coupled to each other, a differentiator arrangement providing said second measure signal from said AC electric voltage.

According to an embodiment of the present invention, the control unit is arranged for determining said capacitance values of the first and second capacitive couplings according to amplitudes of the first and second measure signals. Preferably, the control unit is further arranged for determining the amplitude of the AC electric voltage according to the amplitudes of first or second measure signal and to the capacitance values of the first and second capacitive couplings.

According to an embodiment of the present invention, the first and second measure signals have a phase shift with respect to each other, said phase shift between the first and second measure signals depending on the capacitance values of the first and second capacitive couplings. Preferably, the control unit is further arranged for:

determining said phase shift between the first and second measure signals, determining said capacitance values of the first and second capacitive couplings according to said phase shift between the first and second measure signals, and determining the amplitude of the AC electric voltage according to the first or second measure signal, and to the capacitance values of the first and second capacitive couplings.

According to an embodiment of the present invention, said measurement section comprises first and second resistive elements electrically coupleable to the first and second capacitive elements, respectively. Preferably, the first and second capacitive elements and, respectively, the first and second resistive elements define, when coupled to each other, a high-pass filter providing said second measure signal from said AC electric voltage.

According to an embodiment of the present invention, the further measurement section comprises an energy harvesting module for harvesting energy from said inductive coupling. Preferably, the further measurement section also comprises a switching device selectively operable in a first configuration allowing energy harvesting by said energy harvesting unit or in a second configuration allowing provision of the third measure signal and preventing said energy harvesting.

According to an embodiment of the present invention, the further measurement section further comprises a charge storage element for storing electric charge according to said energy harvesting and for supplying said electric charge to the measurement section, to the further measurement section, and to the control unit.

According to an embodiment of the present invention, the further measurement section comprises a current clamp device for performing said inductive coupling with the first or second wires.

According to an embodiment of the present invention, the current clamp device comprises a split core current transformer.

According to an embodiment of the present invention, said measurement section comprises first and second electrically conductive layers adapted to be provided on portions of the first and second wires, respectively. Preferably, the portion of the first wire and the first electrically conductive layer thereon define said first capacitive element between the first wire and the measurement section, and, preferably, the portion of the second wire and the second electrically conductive layer thereon define said second capacitive element between the second wire and the measurement section.

Another aspect of the present invention relates to a corresponding method for determining said parameters of the AC electric signal.

The present invention allows determining electric voltage and/or electric current waveforms (i.e., amplitude and phase shift) of an AC signal (for example, the AC signal in the line and neutral wires of an electrical distribution system) by using inductive and capacitive couplings. Thanks to inductive and capacitive couplings, the electric voltage and/or electric current waveforms are determined in a non-intrusive manner (i.e., without altering the overall load of the electrical distribution system) and independently from wire geometry (which may also significantly differ from a measure point to another one) and from wire spatial geometry or arrangement (i.e., regardless of whether the wire is bent or twisted), thus providing highly precise measurements.

Moreover, the proposed meter apparatus features a simple circuit implementation requiring low cost hardware, so that it can profitably be implemented based on the multi-sensor approach.

BRIEF DESCRIPTION OF THE ANNEXED DRAWINGS

Figure 2A:
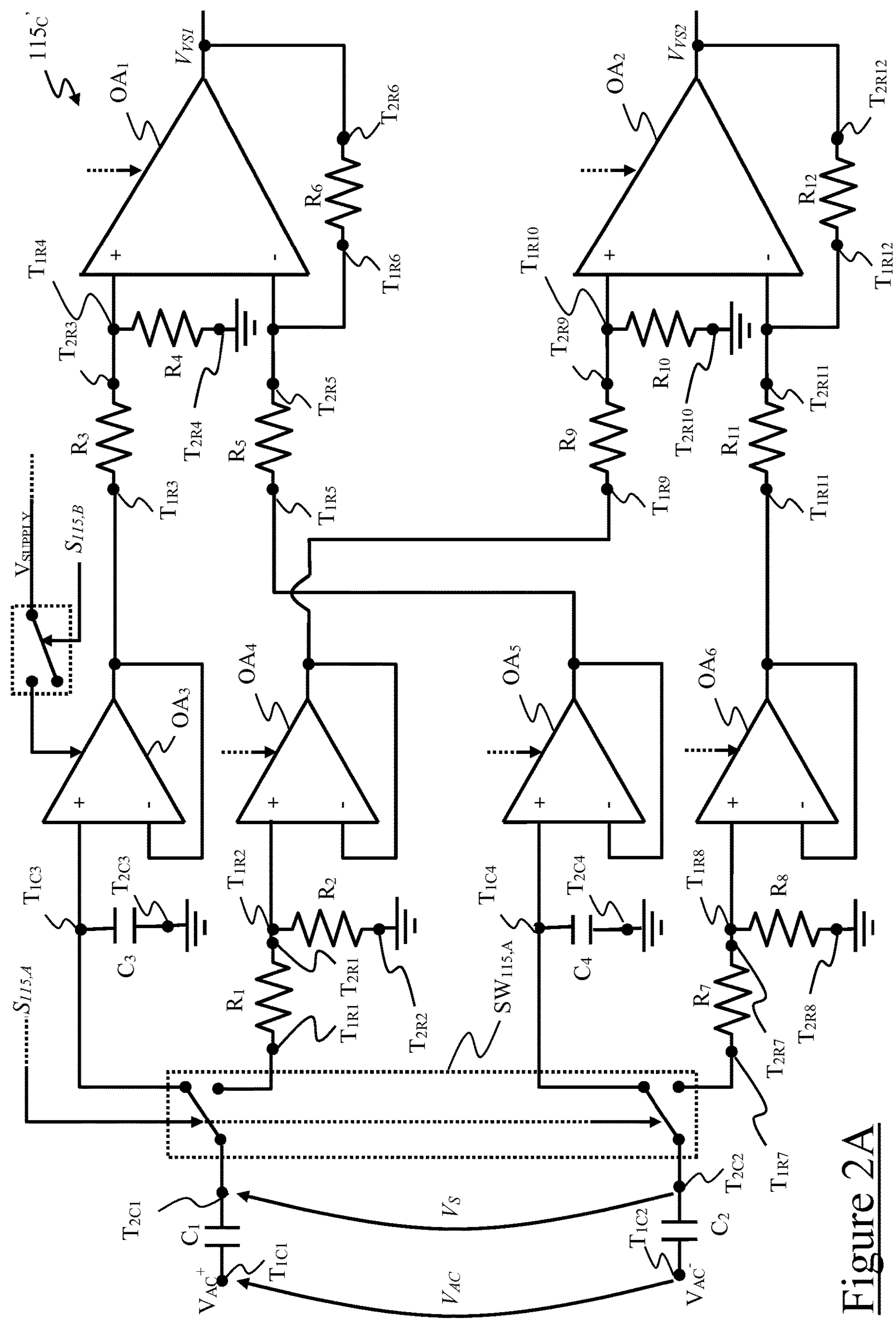
Figure 2B:
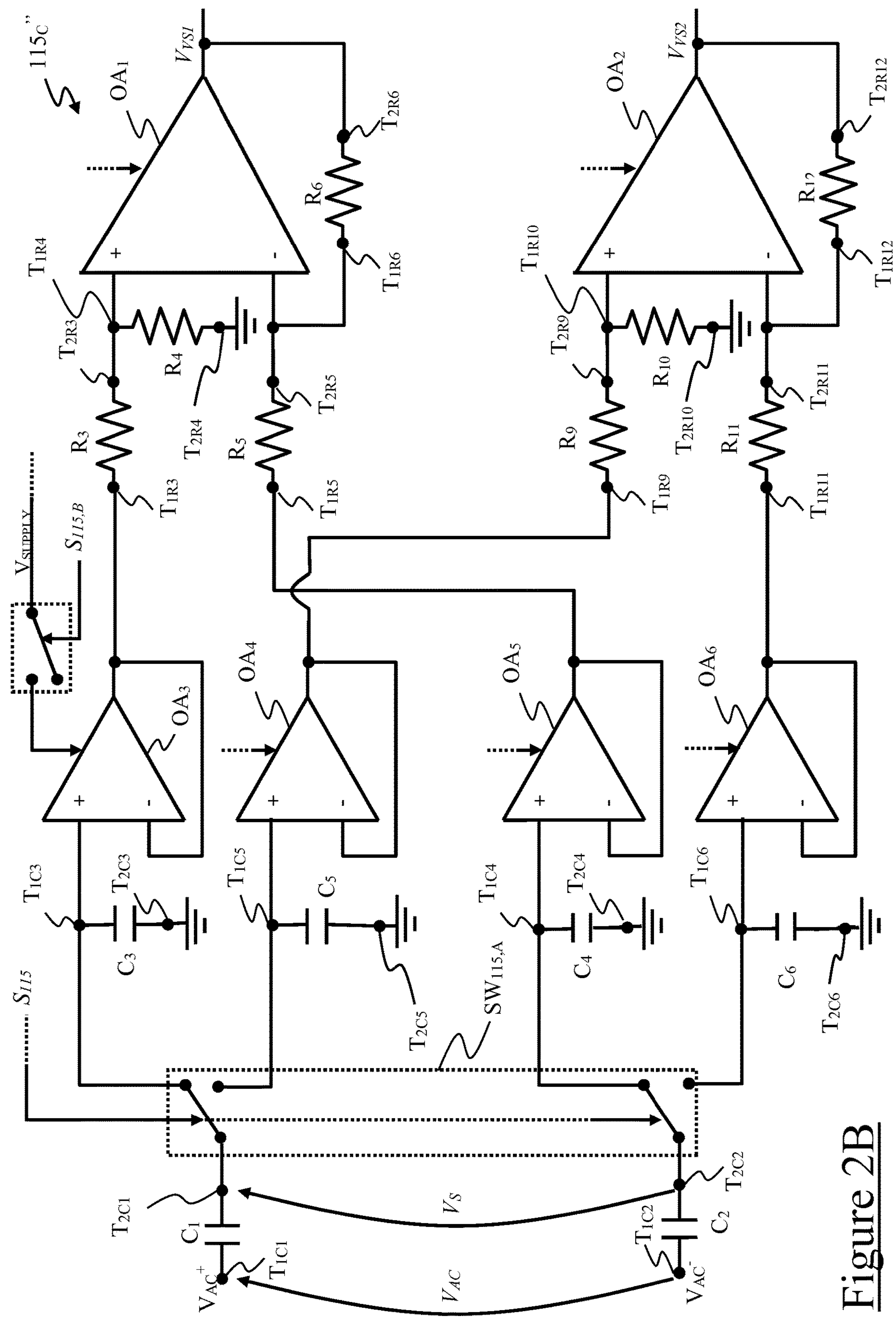
Figure 2C:
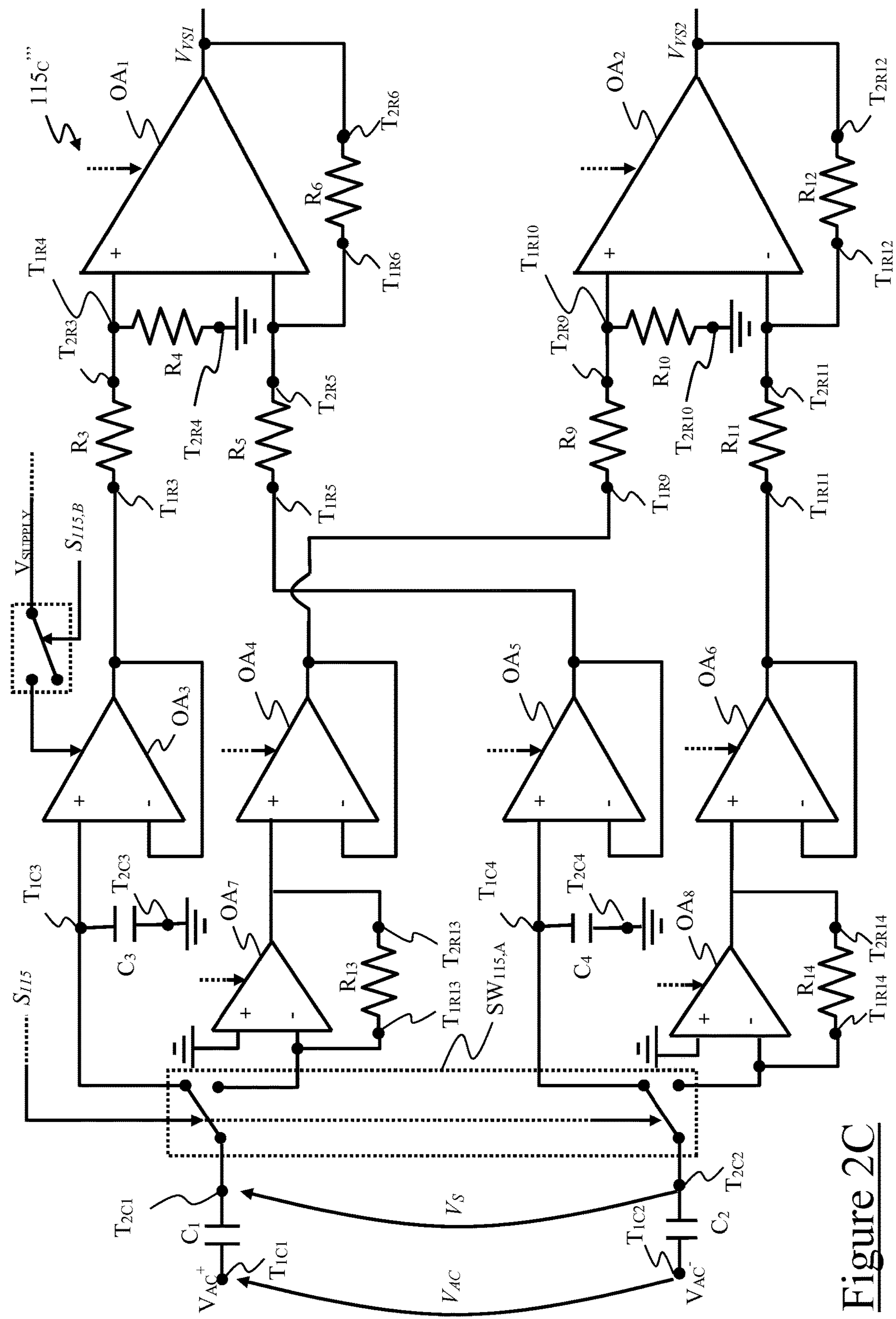
Figure 3:
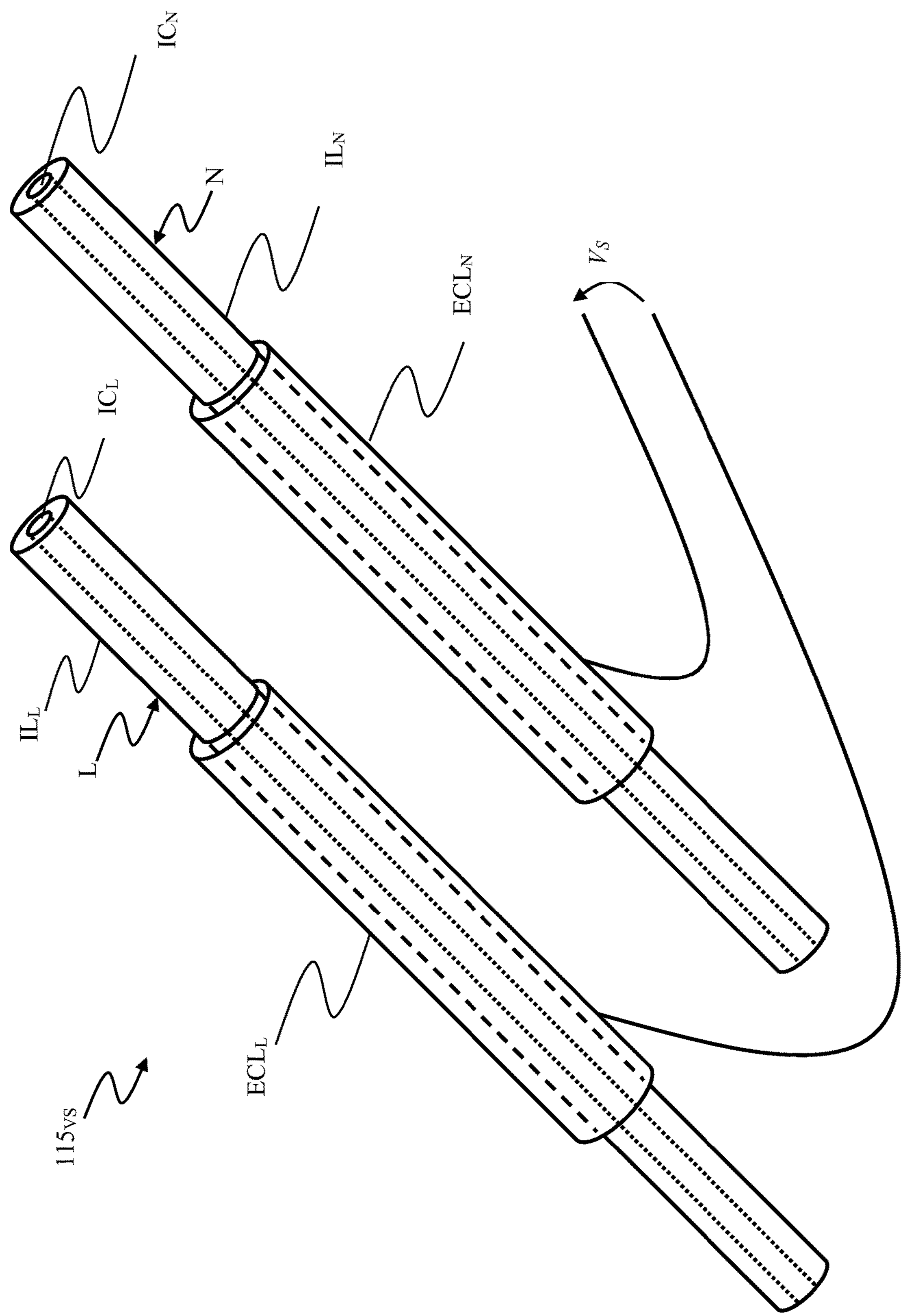

These and other features and advantages of the present invention will be made apparent by the following description of some exemplary and non-limitative embodiments thereof; for its better intelligibility, the following description should be read making reference to the attached drawings, wherein:

FIG. 1 schematically shows, in terms of functional blocks, a meter apparatus according to an embodiment of the present invention;

FIGS. 2A-2C show circuit representations of voltage measurement sections of said meter apparatus according to respective embodiments of the present invention, and FIG. 3 shows a voltage sensing arrangement of said meter apparatus according to an embodiment of the present invention.

DETAILED DESCRIPTION OF PREFERRED EMBODIMENTS OF THE INVENTION

With reference to the drawings, FIG. 1 schematically shows, in terms of functional blocks, a meter apparatus 100 according to an embodiment of the present invention.

The meter apparatus 100 is preferably arranged for determining one or more parameters of an “Alternate Current” (AC) electric signal (hereinafter, AC signal) in one or more wires, preferably line L and neutral N wires of an electrical distribution system (the electrical distribution system being not shown).

As schematically represented in the figure, the line L and neutral N wires are preferably intended to supply electric power to one or more electric loads (for example, electric loads in residential households and buildings), such as the electric load 105. The electric load 105 may for example comprise a small appliance (such as personal computers, laser printers, battery chargers), the electric load 205 being for example powered by a “Switched-Mode Power Supply” (SMPS) module. A SMPS module is typically configured for efficiently transferring electric power through the electrical distribution system to the electric load 205, while minimizing wasted energy by continually switching between low-dissipation, high-dissipation and no-dissipation states.

The AC signal comprises an AC electric current (hereinafter, AC current) $I_{AC}$ through the L and neutral N wires and an AC electric voltage (hereinafter, AC voltage) $V_{AC}$ across the L and neutral N wires, and the AC signal parameters to be determined preferably comprise at least one among:

- amplitude of the AC current $I_{AC}$, and hence the waveform thereof (i.e., an indication of the changes in amplitude of the AC current $I_{AC}$ over a certain period of time);
- amplitude of the AC voltage $V_{AC}$, and hence the waveform thereof (i.e., an indication of the changes in amplitude of the AC voltage $V_{AC}$ over a certain period of time);
- phase shift between the AC current $I_{AC}$ and the AC voltage $V_{AC}$, and hence the power factor (i.e., the ratio between the real power flowing to the load 105, namely the power resulting from resistive components, and the apparent power, namely the vector summation of both the real power and the reactive power resulting from capacitive and inductive components).

The AC signal parameters may act as feedback information about energy consumption of the electric load 205, which can be used to promote energy awareness to residents. Indeed, timely electrical consumption feedback information through real-time metering may reduce electrical consumption by a fraction of 10-30%, and may lead to bill saving (indeed, the feedback information may be used to change energy consumption, for example by enabling the use of one or more appliances when it is least expensive).

Moreover, determining the amplitude of the AC voltage $V_{AC}$ and/or of the AC current $I_{AC}$ in the line L and neutral N wires allows determining harmonic distortion in the electrical distribution system. Harmonic distortion typically affects electric loads powered by SMPS modules, and may cause, inter alia, large load currents in the neutral wire N of a three-phase electrical distribution system (which can cause potential fire hazards, as only the line wire L is usually protected by circuit breakers), overheating (which may shorten the life of the electronic devices), poor power factor of the electric loads (e.g. power factor lower than 0.9, which could result in monthly utility penalty fees), resonance (which produces over-current surges), false tripping of circuit breakers, and electric load malfunctions.

Broadly speaking, the meter apparatus 100 in its widest conception preferably comprises:

a voltage measurement section 115 configured for providing first $V_{VS1}$ and second $V_{VS2}$ measure signals each one indicative of the AC electric voltage $V_{AC}$ based on a first capacitive coupling with the line wire L and on a second capacitive coupling with the neutral wire N. Preferably, as better discussed below, the first $V_{VS1}$ and second $V_{VS2}$ measure signals (hereinafter referred to as first $V_{VS1}$ and second $V_{VS2}$ voltage measure signals, respectively) depend on capacitance values of the first and second capacitive couplings. More preferably, as discussed below, the voltage measurement section 115 is such that the first voltage measure signal $V_{VS1}$ is in a respective predetermined phase relationship (the first voltage measure signal $V_{VS1}$ being for example in phase) with respect to the AC voltage $V_{AC}$; and a control unit 120 (e.g., a 32-bit microcontroller integrating an "Analog-to-Digital Conversion" module, or ADC module, not shown) for determining capacitance values of the first and second capacitive couplings according to the first $V_{VS1}$ and second $V_{VS2}$ voltage measure signals, and for determining the amplitude of the AC voltage $V_{AC}$ according to the first $V_{VS1}$ or second $V_{VS2}$ voltage measure signal, and to the capacitance values of the first and second capacitive couplings.

In the preferred, not limiting, embodiment herein discussed, the meter apparatus 100 also comprises a current measurement section 110 configured for providing a signal $V_{IS}$ indicative of the AC current $I_{AC}$ (hereinafter, current measure signal $V_{IS}$) based on an inductive coupling with the line L and neutral N wires. Preferably, as discussed below, the current measurement section 110 is such that the current measure signal $V_{IS}$ is in a respective predetermined phase relationship (the current measure signal $V_{IS}$ being for example in phase) with respect to the AC current $I_{AC}$, and the control unit 120 is also configured for determining the phase shift between the AC current $I_{AC}$ and the AC voltage $V_{AC}$ according to the phase shift between the current measure signal $V_{IS}$ from the current measurement section 110 and the first voltage measure signal $V_{VS1}$ from the voltage measurement section 115 (and, when provided, according to the predetermined phase relationships).

The control unit 120 (and, preferably, also the ADC module) is preferably supplied by means of one or more supply voltages $V_{SUPPLY}$ (for example including an upper supply voltage, e.g. +5V, and a lower supply voltage, e.g. −5V) with respect to a reference voltage (such as a 0V or ground voltage).

Preferably, as illustrated, the current measurement section 110 comprises a current sensing arrangement $\mathbf{110}_{CS}$ for sensing the AC current $I_{AC}$ through the line L and neutral N wires based on said inductive coupling—the current sensing arrangement $\mathbf{110}_{CS}$, not limitative for the present invention, is illustrated as a generic oval block in the figure. More preferably, the current sensing arrangement $\mathbf{110}_{CS}$ comprises a non-invasive (or non-intrusive) current sensor, the current sensing arrangement $\mathbf{110}_{CS}$ being for example based on a current clamp device (not shown). A current clamp device is an electrical device having two jaws which open to allow clamping around a wire (e.g. the line wire L, as conceptually illustrated in the figure by the oval block $\mathbf{110}_{CS}$ intercepting the line wire L). This allows the AC current $I_{AC}$ through the line L and neutral N wires to be sensed, and hence measured, without having to make direct physical contact with them in an intrusive manner (such as by interrupting or cutting the wires). Even more preferably, the current clamp device is (or comprises) a so-called split core current transformer. Broadly speaking, a split core current transformer comprises a split ring of ferrite or soft iron, and a wire coil wound round one or both halves, which form one winding of the current transformer—with the wire around which it is clamped (the line wire L in the example at issue) that forms the other winding. In this way, when sensing the AC current $I_{AC}$, the clamped wire (the line wire L in the example at issue) forms the primary winding and the coil forms the secondary winding of the current transformer.

According to the disclosed embodiment, the AC current sensed by the current sensing arrangement $\mathbf{110}_{CS}$ (hereinafter, sensed current $I_S$) depends on the AC current $I_{AC}$ through the line L and neutral N wires and on the winding turns ratio of the current transformer.

Preferably, the current measurement section 110 also comprises a conversion module $\mathbf{110}_C$ for converting the sensed current $I_S$ into the current measure signal $V_{IS}$, which is adapted to be processed by the control unit 120 for determining the AC signal parameters (as better discussed in the following). Assuming, as usual, that the ADC module of the control unit 120 carries out a voltage conversion, the current measure signal $V_{IS}$ is advantageously a voltage signal—in any case, the possibility that the ADC module of the control unit 120 carries out the conversion of a different electrical quantity, such as a current conversion, is not excluded, in which case the conversion module $\mathbf{110}_C$ may be omitted or simplified.

More preferably, the current measure signal $V_{IS}$ is adapted to (i.e., it is within) the full scale range at which the control unit 120 (and, particularly, the ADC module thereof) is allowed to operate (i.e., between the upper and lower supply voltages). In order to achieve that, the conversion module $\mathbf{110}_C$ preferably comprises a voltage divider (e.g., a resistive voltage divider), not shown. However, in case that the ADC module of the control unit 120 carries out a current conversion, and the current measure signal $V_{IS}$ is therefore a current signal, the conversion module $\mathbf{110}_C$ preferably comprises a current divider (e.g., a resistive current divider), not shown.

Preferably, as mentioned above, the current measure signal $V_{IS}$ features a predetermined phase relationship with respect to the AC current $I_{AC}$ (for example, by purposely adding the predetermined phase shift in the conversion module $\mathbf{110}_C$). Even more preferably, the current measure signal $V_{IS}$ is in phase with respect to the AC current $I_{AC}$.

Preferably, as illustrated, the current measurement section 110 further comprises an energy harvesting module $\mathbf{110}_H$ for harvesting energy from said inductive coupling (and, hence, from the sensed current $I_S$) when the conversion module $\mathbf{110}_C$ (and the subsequent processing by the control unit 120) is not enabled. Even more preferably, the current measurement section 110 also comprises a power supply module 125 having one or more charge storage elements (not shown), such as a battery, a capacitor, or, preferably, as herein assumed, a super capacitor, for storing electric charge according to the harvested energy and for supplying such a stored electric charge to the control unit 120 (and, preferably, to the current 110 and voltage 115 measurement sections in a selective way, as discussed below) for powering thereof. According to the exemplary considered embodiment, such a stored electric charge is supplied to the control unit 120 (and, preferably, to the current 110 and voltage 115 measurement sections) in the form of said supply voltages $V_{SUPPLY}$.

In order to achieve that, the current measurement section 110 preferably comprises a switching device $SW_{110,A}$, which is preferably switchable (i.e., selectively operable) between a first configuration enabling electrical coupling (e.g., direct connection) between the current sensing arrangement $\mathbf{110}_{CS}$ and the energy harvesting module $\mathbf{110}_H$ thereby allowing energy harvesting from the sensed current $I_S$, and a second configuration enabling electrical coupling (e.g., direct connection) between the current sensing arrangement $\mathbf{110}_{CS}$ and the conversion module $\mathbf{110}_C$ thereby preventing energy harvesting and allowing conversion of the sensed current $I_S$ into the corresponding current measure signal $V_{IS}$.

Preferably, the switching of the switching device $SW_{110,A}$ in the first or second configuration is commanded by a command signal $S_{110}$ from the control unit 120, the command signal $S_{110}$ being for example a digital signal taking high or low logic levels (e.g. equal to the upper supply voltage or to the ground voltage, respectively).

According to the preferred, but not limiting, illustrated embodiment, the current measurement section 110 also comprises a further switching device $SW_{110,B}$, which is preferably switchable (i.e., selectively operable) between a first, or open, configuration preventing electrical coupling between the power supply module 125 and the conversion module $\mathbf{110}_C$ (thus preventing powering, and hence operation, thereof) and a second, or closed, configuration enabling electrical coupling (e.g., direct connection) between the power supply module 125 and the conversion module $\mathbf{110}_C$ (thus allowing operation thereof, and, hence, conversion of the sensed current $I_S$ into the current measure signal $V_{IS}$).

Advantageously, although not necessarily, the switching of the switching device $SW_{110,B}$ in the open or closed configuration is commanded by the command signal $S_{110}$ (i.e., the same command signal $S_{110}$ that also commands the switching of the switching device $SW_{110,A}$), so that the conversion module $\mathbf{110}_C$ is powered only when required, i.e. only when the sensed current $I_S$ has to be converted into the current measure signal $V_{IS}$ for determining the AC signal parameters. This allows achieving a non-negligible power saving.

Preferably, as illustrated, the voltage measurement section 115 comprises a voltage sensing arrangement $\mathbf{115}_{VS}$ for sensing the AC voltage $V_{AC}$ across the line L and neutral N wires—the voltage sensing arrangement $\mathbf{115}_{VS}$, not limitative for the present invention, is illustrated as a generic oval block in the figure. More preferably, the voltage sensing arrangement $\mathbf{115}_{VS}$ comprises a non-invasive voltage sensor, being for example a voltage sensor based on capacitive coupling. In order to achieve that, as visible in the exemplary voltage sensing arrangement $\mathbf{115}_{VS}$ of FIG. 3, a first electrically conductive layer $ECL_L$ is preferably provided on the line wire L (i.e. on a respective portion, hereinafter referred to as sensed portion of the line wire L), and a second electrically conductive layer $ECL_N$ is provided on the neutral wire N (i.e. on a respective portion, hereinafter referred to as sensed portion of the neutral wire N), as conceptually illustrated also in FIG. 1 by the oval block $\mathbf{115}_{VS}$ intercepting both line L and neutral N wires. In this way, first and second capacitive elements (e.g., capacitors) are formed which are associated with the line L and neutral N wires (i.e., with the sensed portions of the line L and neutral N wires), respectively. The first sensing capacitor is made up of the internal conductor $IC_L$ and the insulating layer $IL_L$ of the line wire L (i.e., of the sensed portion of the line wire L), and of the first electrically conductive layer $ECL_L$; the second sensing capacitor is instead made up of the internal conductor $IC_N$ and the insulating layer $IL_N$ of the neutral wire N (i.e., of the sensed portion of the neutral wire N), and of the second electrically conductive layer $ECL_N$. Thus, preferably, the sensed portion of the line wire L and the first electrically conductive layer $ECL_L$ act, respectively, as first and second terminals of the first sensing capacitor, and the sensed portion of the neutral wire N and the second electrically conductive layer $ECL_N$ act, respectively, as first and second terminals of the second sensing capacitor.

Assuming, as usual, that the line L and neutral N wires are cylindrical in shape, the first $ECL_L$ and second $ECL_N$ electrically conductive layers are advantageously provided around the sensed portion of the line wire L and the sensed portion of the neutral wire N, respectively (so as to form cylindrical conductive layers), such that the first and second sensing capacitors result in cylindrical first and second capacitors—although this should not be construed in a restrictive manner.

Preferably, the first $ECL_L$ and second $ECL_N$ electrically conductive layers are copper sheets (or tapes). More preferably, the first $ECL_L$ and second $ECL_N$ electrically conductive layers are self-adhesive copper sheets adapted to be wrapped around the sensed portion of the line wire L and the sensed portion of the neutral wire N, respectively.

The first $ECL_L$ and second $ECL_N$ electrically conductive layers preferably have same length and thickness.

According to an embodiment of the present invention, the length of the first $ECL_L$ and second $ECL_N$ electrically conductive layers is of the order of a few centimeters (for example between 1 cm and 5 cm, such as 1.25 cm), which descends from the measurement sensitivity achieved by the conditioning module $\mathbf{115}_C$ (as discussed below). This very short length of the first $ECL_L$ and second $ECL_N$ electrically conductive layers (especially compared to known solutions of voltage sensors based on capacitive coupling) implies that the AC voltage $V_{AC}$ and/or the AC current $I_{AC}$ waveforms are determined independently from wire geometry (which may also significantly differ from a measure point to another one) and from wire spatial geometry or arrangement (i.e., regardless of whether the wire is bent or twisted).

According to an embodiment of the present invention, the thickness of the first $ECL_L$ and second $ECL_N$ electrically conductive layers is of the order of the hundredths of millimeters (for example, between 0.01 mm and 0.1 mm, such as 0.35 mm), so that when they are wrapped around the sensed portion of the line wire L and the sensed portion of the neutral wire N, respectively, substantially no additional space occupation arises. This very low space occupation of the first $ECL_L$ and second $ECL_N$ electrically conductive layers implies the adaptability of the voltage sensing arrangement $\mathbf{115}_{VS}$ (and, hence, of the meter apparatus 100) to substantially any measure point.

In the circuit representations of FIGS. 2A-2C, the first and second sensing capacitors are denoted by the references $C_1$ and $C_2$, the first and second terminals of the first sensing capacitor $C_1$ are denoted by $T_{1C1}$ and $T_{2C1}$, respectively, and first and second terminals of the second sensing capacitor $C_2$ are denoted by $T_{1C2}$ and $T_{2C2}$, respectively.

Assuming, as usual, that the permittivity of the insulating material is the same in both line L and neutral N wires and that the radius is the same for both the line L and neutral N wires, and considering same length and thickness for the first $ECL_L$ and second $ECL_N$ electrically conductive layers, the first $C_1$ and second $C_2$ sensing capacitors feature a same capacitance value $C_S$ (although this should not be construed in a restrictive manner).

In this arrangement, a first voltage forms at the first electrically conductive layer $ECL_L$ (or, equivalently, at the second terminal $T_{2C1}$ of the first sensing capacitor $C_1$) according to the AC voltage $V_{AC}$ in the sensed portion of the line wire L and to the capacitance value $C_S$, and a second voltage forms at the second electrically conductive layer $ECL_N$ (or, equivalently, at the second terminal $T_{2C2}$ of the second sensing capacitor $C_2$) according to the AC voltage $V_{AC}$ in the sensed portion of the neutral wire N and to the capacitance value $C_S$. This equals to say that, as visible in the circuit representation of FIG. 2A-2C, the AC voltage $V_{AC}$ is applied between the first terminal $T_{1C1}$ of the first sensing capacitor $C_1$ and the first terminal $T_{1C2}$ of the second sensing capacitor $C_2$, and that a respective voltage $V_S$ (depending on the capacitance value $C_S$), hereinafter referred to as sensed voltage $V_S$, is applied between the second terminal $T_{2C1}$ of the first sensing capacitor $C_1$ and the second terminal $T_{2C2}$ of the second sensing capacitor $C_2$—the differential nature of the sensed voltage $V_S$ being also conceptually represented in FIGS. 1 and 3 by the arrow $V_S$ across the output lines of the voltage sensing arrangement $\mathbf{115}_{VS}$).

The capacitance value $C_S$, which depends on the wire size, is unknown a priori, as it depends on geometrical and electrical features of the wires at the measure point where the meter apparatus 100 is intended to be used. However, as will be understood from the following discussion, thanks to the present invention, the amplitude of the AC voltage $V_{AC}$ (as well as the phase shift between AC voltage $V_{AC}$ and the AC current $I_{AC}$, when the current measurement section 110 is provided) is independent from the capacitance value $C_S$ (or from the capacitance values, when different capacitance values for the first $C_1$ and second $C_2$ sensing capacitors are expected), and hence from the measure point.

Back to FIG. 1, the voltage measurement section 115 preferably comprises a conditioning module $\mathbf{115}_C$ for receiving the sensed voltage $V_S$ from the voltage sensing arrangement $\mathbf{115}_{VS}$ and for conditioning it into the voltage measure signals $V_{VS1}$,$V_{VS2}$, which are adapted to be processed by the control unit 120 (preferably, together with the current measure signal $I_{AC}$) for determining the AC signal parameters. Assuming, as usual, that the ADC module of the control unit 120 carries out a voltage analog-to-digital conversion, the voltage measure signals $V_{VS1}$,$V_{VS2}$ are advantageously voltage signals—in any case, the possibility that the ADC module of the control unit 120 carries out the conversion of a different electrical quantity, such as a current conversion, is not excluded, in which case the conditioning module $\mathbf{115}_C$ may be accordingly modified.

More preferably, as conceptually illustrated in the figures, the voltage measure signals $V_{VS1}$,$V_{VS2}$ are single-ended voltage signals, i.e. voltage signals referred to proper reference voltages, and adapted to (i.e., it is within) the full scale range at which the ADC module of the control unit 120 is allowed to operate. Even more preferably, the voltage measure signals $V_{VS1}$,$V_{VS2}$ are both referred to a common reference voltage, the common reference voltage being for example between the supply voltages $V_{SUPPLY}$ (such as the ground voltage).

Broadly speaking, as better discussed in the following, the conditioning module $\mathbf{115}_C$ according to the considered embodiment comprises first and second conditioning branches (for the AC voltage $V_{AC}$) for providing the first $V_{VS1}$ and second $V_{VS2}$ voltage measure signals, respectively.

In order to achieve that, the voltage measurement section 115 preferably comprises a switching device $SW_{115,A}$, which is preferably switchable between a first configuration electrically coupling the voltage sensing arrangement $\mathbf{115}_{VS}$ to the first conditioning branch of the conditioning module $\mathbf{115}_C$ (thereby allowing it to provide the first voltage measure signal $V_{VS1}$ and, hence, allowing the control unit 120 to determine the phase shift between the AC current $I_{AC}$ and the AC voltage $V_{AC}$ according to the phase shift between the first voltage measure signal $V_{VS1}$ and the current measure signal $V_{IS}$), and a second configuration electrically coupling the voltage sensing arrangement $\mathbf{115}_{VS}$ to the second branch of the conditioning module $\mathbf{115}_C$ (thereby allowing it to provide the second voltage measure signal $V_{VS2}$ and, hence, allowing the control unit 120 to determine the capacitance value $C_S$ according to the first $V_{VS1}$ and second $V_{VS2}$ voltage measure signals, and the amplitude of the AC voltage $V_{AC}$ according to the first $V_{VS1}$ or second $V_{VS2}$ voltage measure signal, and to the determined capacitance value $C_S$, as detailed below).

In order to take into account the differential nature of the AC voltage $V_{AC}$, which requires to condition both the voltage at the first terminal $T_{1C1}$ of the first sensing capacitor $C_1$ (referred to as AC voltage $V_{AC}^+$) and the voltage at the first terminal $T_{1C2}$ of the second sensing capacitor $C_2$ (referred to as AC voltage $V_{AC}^-$, with the AC voltage $V_{AC}$ that thus corresponds to the difference between the AC voltage $V_{AC}^+$ and the AC voltage $V_{AC}^-$), the first conditioning branch (for the AC voltage $V_{AC}$) preferably comprises a first sub-branch for receiving the AC voltage $V_{AC}^+$ and a second sub-branch for receiving the AC voltage $V_{AC}^-$, and, more preferably, the second conditioning branch preferably comprises a first sub-branch for receiving the AC voltage $V_{AC}^+$ and a second sub-branch for receiving the AC voltage $V_{AC}^-$. In this exemplary arrangement, the switching device $SW_{115,A}$ preferably comprises two switching elements, namely (as better illustrated in FIGS. 2A-2C) a first switching element for electrically coupling the first sensing capacitor $C_1$ (and, hence, for providing the AC voltage $V_{AC}^+$) to the first or second sub-branches of the first conditioning branch when the switching device $SW_{115,A}$ takes the first or second configuration, respectively, and a second switching element for electrically coupling the second sensing capacitor $C_2$ (and, hence, for providing the AC voltage $V_{AC}^-$) to the first or second sub-branches of the second conditioning branch when the switching device $SW_{115,A}$ takes the first or second configuration, respectively. In other words, in the first configuration of the switching device $SW_{115,A}$ the conditioning module $\mathbf{115}_C$ (by enabling of the first sub-branches of the first and second conditioning branches) provides the first voltage measure signal $V_{VS1}$, whereas in the second configuration of the switching device $SW_{115,A}$ the conditioning module $\mathbf{115}_C$ (by enabling of the second sub-branches of the first and second conditioning branches) provides the second voltage measure signal $V_{VS2}$.

Preferably, the switching of the switching device $SW_{115,A}$ in the first or second configuration is commanded by a proper command signal $S_{115,A}$ from the control unit 120, the command signal $S_{115,A}$ being for example a digital signal (e.g., similar to the command signal $S_{110}$). The command signal $S_{115,A}$ preferably commands both the switching elements of the switching device $SW_{115,A}$ concurrently.

According to the preferred, but not limiting, illustrated embodiment, the voltage measurement section 115 also comprises a further switching device $SW_{115,B}$, which is preferably switchable (i.e., selectively operable) between a first, or open, configuration preventing electrical coupling between the power supply module 125 and the conditioning module $115_C$ (thus preventing powering, and hence operation, thereof) and a second, or closed, configuration enabling electrical coupling (e.g., direct connection) between the power supply module 125 and the conditioning module $115_C$ (thus allowing operation thereof, and hence conditioning of the sensed voltage $V_S$ into the corresponding voltage measure signals $V_{VS1}$,$V_{VS2}$).

The switching of the switching device $SW_{115,B}$ in the open or closed configuration is advantageously commanded by a command signal $S_{115,B}$ different from the command signal $S_{115,A}$ that commands the switching of the switching device $SW_{115,A}$, such that, regardless of the switching device $SW_{115,A}$ configuration, the conditioning module $115_C$ is energized only when required, i.e. only when the sensed voltage $V_S$ has to be conditioned into the voltage measure signals $V_{VS1}$,$V_{VS2}$ for determining the AC signal parameters.

According to a preferred, but not limitative, embodiment of the present invention, the command signals $S_{110}$, $S_{115,B}$ are synchronized to each other, e.g. such that the conversion module $110_C$ in the current measurement section 110 and the conditioning module $115_C$ in the voltage measurement section 115 are both powered (and, hence, enabled) during a predetermined measurement period (e.g., of the order of milliseconds or even second) in order to provide the current $V_{IS}$ and voltage $V_{VS1}$, $V_{VS2}$ measure signals to the control unit 120 within a measurement time window (with the command signal $S_{115,A}$ that, within the measurement period, sequentially enables the first and second sub-branches of the first and second conditioning branches for providing the voltage measure signals $V_{VS1}$,$V_{VS2}$). However, according to the AC signal parameters to be determined and/or to the specific application, the command signals $S_{110}$,$S_{115,B}$ may also be independent from each other (at least in part).

Preferably, during the predetermined measurement time window:

- the switching device $SW_{110,A}$ is set in the first configuration and the switching device $SW_{110,B}$ is set in the closed configuration (so as to convert the sensed current $I_S$ into the current measure signal $V_{IS}$), and
- the switching device $SW_{115,B}$ is set in the closed configuration and the switching device $SW_{115,A}$ is set in the first configuration (which is preferably its default configuration) so as to condition the AC voltage $V_{AC}$ into the first voltage measure signal $V_{VS1}$, thereafter the switching device $SW_{115,A}$ is set in the second configuration with the switching device $SW_{115,B}$ still in the closed configuration (so as to condition the AC voltage $V_{AC}$ into the second voltage measure signal $V_{VS2}$). The switching device $SW_{110,B}$ is advantageously set in the open configuration as soon as the current measure signal $V_{IS}$ is provided, regardless of the conditioning progress in the conditioning module $115_C$, so as to avoid unnecessary powering the conversion module $110_C$.

Advantageously, during the time periods between two consecutive measurements time windows (hereinafter, referred to as harvesting time periods), each one of the order of minutes, hours, days or even months according to the AC signal parameters to be determined and/or to the specific application of the meter apparatus 100, the conversion module $110_C$ in the current measurement section 110 and the conditioning module $115_C$ in the voltage measurement section 115 are both unpowered and hence disabled (switching devices $SW_{110,B}$ and $SW_{115,B}$ both in the open configuration), and the switching device $SW_{110,A}$ in the second configuration enables energy harvesting by the energy harvesting module $110_H$.

Finally, the meter apparatus 100 preferably comprises a wireless network communication interface 130 for receiving the AC signal parameters determined by the control unit 120 (or an indication thereof) and for wirelessly transmitting them to a proper receiving apparatus (e.g., by means of short distance radio frequency technologies).

Thanks to the present invention, the AC voltage $V_{AC}$ and/or the AC current $I_{AC}$ waveforms (i.e., amplitude and phase shift) are determined by using inductive and capacitive couplings, thus in a non-intrusive manner (i.e., without altering the overall electric load of the electrical distribution system). Moreover, thanks to capacitive coupling, and to the measurement sensitivity of the conditioning module $115_C$ (as discussed below), the length of the first $ECL_L$ and second $ECL_N$ conductive layers, and hence of the sensing capacitors $C_1$, $C_2$ thereby obtained, may be very short (e.g., in the order of a few centimeters, such as 1.25 cm). The very short length of the sensing capacitors $C_1$,$C_2$ implies that the AC voltage $V_{AC}$ and/or the AC current $I_{AC}$ waveforms are determined independently from wire geometry (which may also significantly differ from a measure point to another one) and from wire spatial geometry or arrangement (i.e., regardless of whether the wire is bent or twisted), thus providing highly precise measurements.

Moreover, the proposed meter apparatus 100 features a simple circuit implementation requiring low cost hardware (as will be apparent from the following discussion of preferred embodiments of the conditioning module $115_C$ illustrated in FIGS. 2A-2C), so that it can profitably be implemented according to a multi-sensor approach—in any case, the simplicity and the efficiency of the meter apparatus 100 allows it to be implemented according to a single-sensor approach.

FIG. 2A shows a circuit representation of the voltage measurement section 115, and particularly, of the conditioning module, according to a first embodiment of the present invention (the conditioning module according to this first embodiment of the present invention being denoted by $115_C'$ for differentiating it from the conditioning modules of the following embodiments). The conditioning module $115_C'$ is electrically coupled to the voltage sensing arrangement $115_{VS}$ (that, as discussed above, is electrically represented by the first $C_1$ and second $C_2$ sensing capacitors, the AC voltage $V_{AC}$ (or substantially the AC voltage $V_{AC}$) being applied between the first terminals $T_{1C1}$ and $T_{1C2}$ thereof) by means of the switching device $SW_{115,A}$.

For the sake of ease, the electronic components of the conditioning module $115_C'$ have been considered referred to the ground voltage (as conceptually illustrated in the figure by the conventional electrical symbol of a ground terminal providing the ground voltage). Anyway, according to specific design options, the electronic components of the conditioning module $115_C'$ (or at least a part thereof) may be referred to one or more different reference voltages (such the upper supply voltage and/or the lower supply voltage).

Preferably, the conditioning module $115_C'$ comprises, in the first conditioning branch, a first input stage for processing (e.g., scaling) the AC voltage $V_{AC}$ and a first output stage for providing the first voltage measure signal $V_{VS1}$ from the scaled AC voltage, and, in the second conditioning branch, a second input stage for processing the AC voltage $V_{AC}$ and a second output stage for providing the second voltage measure signal $V_{VS2}$ from the processed AC voltage $V_{AC}$ (the specific implementation of the second input stage determining the processing on the AC voltage $V_{AC}$).

Even more preferably, as illustrated, the first input stage comprises a first input capacitive element (e.g., a capacitor) $C_3$ having a first terminal $T_{1C3}$ electrically coupled to the second terminal $T_{2C1}$ of the first sensing capacitor $C_1$ when the switching device $SW_{115,A}$ is in the first configuration (the first terminal $T_{1C3}$ of the first input capacitor $C_3$ being for example electrically floating when the switching device $SW_{115,A}$ is in the second configuration), and a second terminal $T_{2C3}$ electrically coupled to the ground terminal, and a second input capacitive element (e.g., a capacitor) $C_4$ having a first terminal $T_{1C4}$ electrically coupled to the second terminal $T_{2C2}$ of the second sensing capacitor $C_2$ when the switching device $SW_{115,A}$ is in the first configuration (the first terminal $T_{1C4}$ of the second input capacitor $C_4$ being for example electrically floating when the switching device $SW_{115,A}$ is in the second configuration), and a second terminal $T_{2C4}$ electrically coupled to the ground terminal.

Thus, the first sensing capacitor $C_1$ and the first input capacitor $C_3$ define, when electrically coupled to each other, an impedance voltage divider, in particular a capacitive voltage divider for the AC voltage $V_{AC}^+$, whereas the second sensing capacitor $C_2$ and the second input capacitor $C_4$ define, when electrically coupled to each other, a capacitive voltage divider for the AC voltage $V_{AC}^-$ (with the first $C_1$ and second $C_2$ sensing capacitors and, respectively, the first $C_3$ and second $C_4$ input capacitors that, when electrically coupled to each other, define as a whole a capacitive voltage divider for the AC voltage $V_{AC}$). Anyway, nothing prevents from implementing one or more impedance voltage dividers other than the capacitive voltage dividers, such as inductive voltage dividers, resistive voltage dividers or a combination thereof.

Assuming, as discussed above, a same capacitance value $C_S$ for both the first $C_1$ and second $C_2$ sensing capacitors, and assuming a same capacitance value $C_I$ for both the first $C_3$ and second $C_4$ input capacitors (the capacitance value $C_I$ being preferably chosen according to the smallest value of the AC voltage $V_{AC}$ that the conditioning module 115$_C$' is required to discern, and/or according to the full scale range at which the ADC module of the control unit 120 is allowed to operate), the voltage at the first terminal $T_{1C3}$ of the first input capacitor $C_3$ is:

$$V_{1C3} = \frac{C_S}{C_S + C_I} V_{AC}^+$$

and the voltage at the first terminal $T_{1C4}$ of the second input capacitor $C_4$ is:

$$V_{1C4} = \frac{C_S}{C_S + C_I} V_{AC}^-$$

Thanks to the impedance voltage dividers $C_1$,$C_3$ and $C_2$,$C_4$, no phase shift is introduced in the voltages $V_{IC3}$ and $V_{IC4}$ with respect to the AC voltages $V_{AC}^+$ and $V_{AC}^-$, respectively.

Preferably, the first output stage of the conditioning module 115$_C$' is arranged for providing the first voltage measure signal $V_{VS1}$ according to a difference between the voltage $V_{IC3}$ from the first sub-branch of the first conditioning branch (or a voltage corresponding thereto) and the voltage $V_{IC4}$ from the first sub-branch of the second conditioning branch (or a voltage corresponding thereto).

This is advantageously achieved by means of a differential amplifier circuit. Preferably, the differential amplifier circuit of the first output stage is conceived such that no phase shift is introduced in the first voltage measure signal $V_{VS1}$ with respect to the voltages $V_{IC3}$ and $V_{IC4}$ (and, hence, with respect to the AC voltage $V_{AC}$)—in any case, as discussed above, the possibility that a predetermined phase shift is introduced in the first input stage and/or in the first output stage is not excluded.

According to the illustrated embodiment, not limiting for the present invention, the differential amplifier circuit of the first output stage comprises:

- an operational amplifier $OA_1$, preferably powered between the supply voltages $V_{SUPPLY}$ upon closing of the switching device $SW_{115,B}$,
- a resistor $R_3$ having a first terminal $T_{1R3}$ electrically coupled (preferably indirectly, for example by means of one or more voltage stabilizing elements as discussed below) to the first terminal $T_{1C3}$ of the first input capacitor $C_3$ for receiving the voltage $V_{IC3}$ and a second terminal $T_{2R3}$ electrically coupled (e.g. directly connected) to a non-inverting input terminal (denoted by "+" in the figure) of the operational amplifier $OA_1$,
- a resistor $R_4$ having a first terminal $T_{1R4}$ electrically coupled (e.g. directly connected) to the second terminal $T_{2R3}$ of the resistor $R_3$ (and, hence, to the non-inverting input terminal of the operational amplifier $OA_1$) and a second terminal $T_{2R4}$ electrically coupled to the ground terminal,
- a resistor $R_5$ having a first terminal $T_{1R5}$ electrically coupled (preferably indirectly, for example by means of one or more voltage stabilizing elements as discussed below) to the first terminal $T_{1C4}$ of the second input capacitor $C_4$ for receiving the voltage $V_{IC4}$ and a second terminal $T_{2R5}$ electrically coupled (e.g. directly connected) to an inverting input terminal (denoted by "−" in the figure) of the operational amplifier $OA_1$, and
- a resistor $R_6$ having a first terminal $T_{1R6}$ electrically coupled (e.g. directly connected) to the second terminal $T_{2R5}$ of the resistor $R_5$ (and, hence, to the inverting input terminal of the operational amplifier $OA_1$) and a second terminal $T_{2R6}$ electrically coupled (e.g., directly connected) to an output terminal of the operational amplifier providing the first voltage measure signal $V_{VS1}$.

In this exemplary configuration, the first voltage measure signal $V_{VS1}$ is (the resistance values of the resistors $R_3$, $R_4$, $R_5$ and $R_6$ being denoted by $R_3$, $R_4$, $R_5$ and $R_6$, respectively):

$$V_{VS1} = V_{1C3}\frac{R_4}{R_3+R_4}\frac{R_5}{R_5+R_6} - V_{1C4}\frac{R_6}{R_5} == \frac{C_S}{C_S+C_I}\left(V_{AC}^+\frac{R_4}{R_3+R_4}\frac{R_5}{R_5+R_6} - V_{AC}^-\frac{R_6}{R_5}\right)$$

Therefore, the first voltage measure signal $V_{VS1}$ has no (or ideally no) phase shift with respect to the AC voltage $V_{AC}$, such that the control unit 120 is allowed to determine the phase shift between the AC current $I_{AC}$ and the AC voltage $V_{AC}$ based on the current measure signal $V_{IS}$ and on the first voltage measure signal $V_{VS1}$—in any case, when a predetermined phase shift is introduced in the first input stage and/or in the first output stage, the control unit 120 is allowed to determine the phase shift between the AC current $I_{AC}$ and the AC voltage $V_{AC}$ also based on the predetermined phase shift.

Preferably, although not necessarily, the phase shift between the AC current $I_{AC}$ and the AC voltage $V_{AC}$ is determined by the control unit 120 according to a zero-crossing technique. Broadly speaking, zero-crossing is a point where the sign of a function, such as a sinusoidal waveform, changes (e.g., from positive to negative or vice versa), and is defined by a crossing of the axis representing the zero value in the graph of the function. In the considered context, the control unit 120 is configured for determining the zero-crossing of the current measure signal $V_{IS}$ (i.e., the time instant at which the current measure signal $V_{IS}$ is zero), and corresponding to the zero crossing of the AC current $I_{AC}$ (by virtue of the absence of phase shifting between the AC current $I_{AC}$ and the current measure signal $V_{IS}$), and the zero-crossing of the first voltage measure signal $V_{VS1}$ (i.e., the time instant at which the first voltage measure signal $V_{VS1}$ is zero), and corresponding to the zero crossing of the AC voltage $V_{AC}$ (by virtue of the absence of phase shifting between the AC voltage $V_{AC}$ and the first voltage measure signal $V_{VS1}$), and the phase shift according to a difference between the time instant at which zero-crossing of the current measure signal $V_{IS}$ takes place and the time instant at which zero-crossing of the first voltage measure signal $V_{VS1}$ takes place (the phase shift being expressed as time shift or angular shift).

Therefore, the meter apparatus 100 so far discussed allows determining the AC current $I_{AC}$ waveform and the phase shift between the AC voltage $V_{AC}$ and the AC current without the need of external power supply (indeed, thanks to the energy harvesting module 110$_H$, the meter apparatus 100 is a self-powering apparatus), with no direct electrical contact to the line L and neutral N wires (indeed, the current 110$_{CS}$ and voltage 115$_{VS}$ sensing arrangements are "applied" externally to the wires, without direct physical contact with them in an intrusive manner, such as by interrupting or cutting the wires), and regardless of wire size, i.e. without requiring calibration because of the wire size (indeed, the capacitance value $C_S$, which depend on the wire size, is not involved in determining the current measure signal $V_{IS}$ in the current measurement section 110, nor it affects the phase of the first voltage measure signal $V_{VS1}$ in the voltage measurement section 115 thanks to the capacitive voltage dividers $C_1$,$C_3$ and $C_2$,$C_4$ and to the resistor-based differential amplifier circuit $OA_1$,$R_3$-$R_6$).

According to the illustrated embodiment, the first and second input stages comprise first $R_1$,$R_2$ and second $R_7$,$R_8$ input resistors electrically coupleable to the first $C_1$ and second $C_2$ sensing capacitors, respectively. Preferably, the first input resistor $R_1$ has a first terminal $T_{1R1}$ electrically coupled to the second terminal $T_{2C1}$ of the first sensing capacitor $C_1$ when the switching device $SW_{115,A}$ is in the second configuration (the first terminal $T_{1R1}$ of the first input resistor $R_1$ being for example electrically floating when the switching device $SW_{115,A}$ is in the first configuration), and the first input resistor $R_2$ has a first terminal $T_{1R2}$ electrically coupled (e.g., directly connected) to a second terminal $T_{2R1}$ of the first input resistor $R_1$ and a second terminal $T_{2R2}$ electrically coupled to the ground terminal. The second input resistor $R_7$ has a first terminal $T_{1R7}$ electrically coupled to the second terminal $T_{2C2}$ of the second sensing capacitor $C_2$ when the switching device $SW_{115,A}$ is in the second configuration (the first terminal $T_{1R7}$ of the second input resistor $R_7$ being for example electrically floating when the switching device $SW_{115,A}$ is in the first configuration), and the second input resistor $R_8$ has a first terminal $T_{1R8}$ electrically coupled (e.g., directly connected) to a second terminal $T_{2R7}$ of the second input resistor $R_7$ and a second terminal $T_{2R8}$ electrically coupled to the ground terminal.

In other words, the first $R_1$,$R_2$ and second $R_7$,$R_8$ input resistors are in series to the first $C_1$ and second $C_1$ sensing capacitors, respectively, when the switching device $SW_{115,A}$ is in the second configuration. Thus, when the switching device $SW_{115,A}$ is in the second configuration, the first sensing capacitor $C_1$ and the first input resistors $R_1$,$R_2$ define a high-pass filter for the AC voltage $V_{AC}^+$, whereas the second sensing capacitor $C_2$ and the second input resistors $R_7$,$R_8$ define a high-pass filter for the AC voltage $V_{AC}^-$ (or, otherwise stated, the first $C_1$ and second $C_2$ sensing capacitors and, respectively, the first $R_1$,$R_2$ and second $R_7$,$R_8$ input resistors, when electrically coupled to each other, define as a whole a high-pass filter for the AC voltage $V_{AC}$).

Assuming, as discussed above, a same capacitance value $C_S$ for both the first $C_1$ and second $C_2$ sensing capacitors, and assuming a same resistance value $R_1$ for both the first $R_1$ and second $R_7$ input resistors and a same resistance value $R_2$ for both the first $R_2$ and second $R_8$ input resistors (the resistance values $R_1$ and $R_2$ being preferably chosen according to the smallest value of the AC voltage $V_{AC}$ that the conditioning module 115$_C$' is required to discern, i.e. for maximizing the span and optimizing the accuracy, and/or according to the full scale range at which the ADC module of the control unit 120 is allowed to operate), the voltage at the first terminal $T_{1R2}$ of the second input resistor $R_2$ (denoted by $V_{T1R2}$) and the voltage at the first terminal $T_{1R8}$ of the second input resistor $R_8$ (denoted by $V_{T1R8}$) are:

$$V_{1R2} = \frac{sC_SR_2}{1+sC_S(R_1+R_2)}V_{AC}^+$$

$$V_{1R8} = \frac{sC_SR_2}{1+sC_S(R_1+R_2)}V_{AC}^-$$

The cut-off frequency $f_{cut\text{-}off}$, and the module |H| and phase φ of the transfer function of the high-pass filter are:

$$f_{cut\text{-}off} = \frac{1}{2\pi C_S(R_1+R_2)}$$

$$|H| = \frac{\omega C_SR_2}{\sqrt{1+\omega^2C_S^2(R_1+R_2)^2}}$$

$$\varphi = \tan^{-1}\left[\frac{1}{\omega C_S(R_1+R_2)}\right]$$

Preferably, the cut-off frequency $f_{cut\text{-}off}$ is sufficiently lower than 50 Hz, so that the AC voltage $V_{AC}$ of the electrical mains is allowed to be transferred with a phase shift across the second sub-branches of the first and second conditioning branches (so that the resulting second voltage measure signal $V_{VS2}$ has a phase shift with respect to the first voltage measure signal $V_{VS1}$, as better discussed below).

Back to FIG. 2A, the second output stage of the conditioning module 115$_C$' is arranged for providing the second voltage measure signal $V_{VS2}$ according to a difference between the voltage $V_{1R2}$ from the second sub-branch of the first conditioning branch and the voltage $V_{1R8}$ from the second sub-branch of the second conditioning branch.

This is advantageously achieved by means of a differential amplifier circuit.

Preferably, the differential amplifier circuit of the second output stage is conceived such that no phase shift is introduced in the second voltage measure signal $V_{VS2}$ with respect to the voltages $V_{1R2}$ and $V_{1R8}$ (so that the phase of the second voltage measure signal $V_{VS2}$ only depends on the phase φ of the transfer function of the high-pass filter, whereby the control unit 120 is allowed to easily determine the, unknown, capacitance value $C_S$ of the first $C_1$ and second $C_2$ sensing capacitors, as discussed herebelow). In any case, nothing prevents from adding a further phase shift in the second output stage.

Even more preferably, the differential amplifier circuit of the second output stage is identical (e.g., in terms of architecture) to the differential amplifier circuit of the first output stage.

According to the illustrated embodiment, not limiting for the present invention, the differential amplifier circuit of the second output stage comprises:

- an operational amplifier $OA_2$, preferably powered between the supply voltages $V_{SUPPLY}$ upon closing of the switching device $SW_{115,B}$; even more preferably, the operational amplifier $OA_2$ is analogous (e.g., in terms of electrical properties) to the operational amplifier $OA_1$;
- a resistor $R_9$ having a first terminal $T_{1R9}$ electrically coupled (preferably indirectly, for example by means of one or more voltage stabilizing elements as discussed below) to the first terminal $T_{1R2}$ of the first input resistor $R_2$ for receiving the voltage $V_{1R2}$ and a second terminal $T_{2R9}$ electrically coupled (e.g. directly connected) to a non-inverting input terminal (denoted by "+" in the figure) of the operational amplifier $OA_2$,
- a resistor $R_{10}$ having a first terminal $T_{1R10}$ electrically coupled (e.g. directly connected) to the second terminal $T_{2R9}$ of the resistor $R_9$ (and, hence, to the non-inverting input terminal of the operational amplifier $OA_2$) and a second terminal $T_{2R10}$ electrically coupled to the ground voltage,
- a resistor $R_{11}$ having a first terminal $T_{1R11}$ electrically coupled (preferably indirectly, for example by means of one or more voltage stabilizing elements as discussed below) to the first terminal $T_{1R8}$ of the second input resistor $R_8$ for receiving the voltage $V_{1R8}$ and a second terminal $T_{2R11}$ electrically coupled (e.g. directly connected) to an inverting input terminal (denoted by "−" in the figure) of the operational amplifier $OA_2$, and
- a resistor $R_{12}$ having a first terminal $T_{1R12}$ electrically coupled (e.g. directly connected) to the second terminal $T_{2R11}$ of the resistor $R_{11}$ (and, hence, to the inverting input terminal of the operational amplifier $OA_2$) and a second terminal $T_{2R12}$ electrically coupled (e.g., directly connected) to an output terminal of the operational amplifier providing the second voltage measure signal $V_{VS2}$.

In this exemplary configuration, the second voltage measure signal $V_{VS2}$ is (the resistance values of the resistors $R_9$, $R_{10}$, $R_{11}$ and $R_{12}$ being denoted by $R_9$, $R_{10}$, $R_{11}$ and $R_{12}$, respectively):

$$V_{VS2} = V_{1R2}\frac{R_{10}}{R_9 + R_{10}}\frac{R_{11}}{R_{11} + R_{12}} - V_{1R8}\frac{R_{12}}{R_{11}} == \frac{sC_S R_2}{1 + sC_S(R_1 + R_2)}\left(V_{AC}^{+}\frac{R_{10}}{R_9 + R_{10}}\frac{R_{11}}{R_{11} + R_{12}} - V_{AC}^{-}\frac{R_{12}}{R_{11}}\right)$$

According to a preferred, not limiting embodiment of the present invention, the structure of the differential amplifier circuit of the second output stage is identical to the structure of the differential amplifier circuit of the first output stage (or substantially identical, as the possibility of including structural differences, e.g. for taking into account manufacturing tolerances or non-idealities of specific electronic components, is not excluded). Moreover, the resistance values $R_9$, $R_{10}$, $R_{11}$ and $R_{12}$ of the resistors $R_9$, $R_{10}$, $R_{11}$ and $R_{12}$ and the electrical properties of the respective operational amplifier $OA_2$ are preferably identical to the resistance values $R_3$, $R_4$, $R_5$ and $R_6$ of the resistors $R_3$, $R_4$, $R_5$ and $R_6$ and to the electrical properties of the operational amplifier $OA_1$, respectively (or substantially identical, as the possibility of including structural differences, e.g. for taking into account manufacturing tolerances or non-idealities of specific electronic components, is not excluded).

Thus, the second voltage measure signal $V_{VS2}$ has a phase shift with respect to the first voltage measure signal $V_{VS1}$, which phase shift is detected and measured by the control unit 120 (e.g., still by means of the zero-crossing technique). In its turn, such a phase shift, which thus is known, depends on the capacitance value $C_I$ of the first $C_3$ and second $C_4$ input capacitors, which is known, and by the capacitance value $C_S$ of the first $C_1$ and second $C_2$ sensing capacitors, which instead is unknown (and depends, inter alia, on wire geometry). Therefore, in the considered embodiment, upon reception of the first $V_{VS1}$ and second $V_{VS2}$ voltage measure signals, the control unit 120 is configured for determining the capacitance value $C_S$ according to the phase shift between the first $V_{VS1}$ and second $V_{VS2}$ voltage measure signals (e.g., by reversing the above equation for the phase φ of the transfer function of the high-pass filter), and thus the amplitude of the AC voltage $V_{AC}$ according to the first $V_{VS1}$ or second $V_{VS2}$ voltage measure signals and to the capacitance value $C_S$ (e.g., by reversing the above equation for the first voltage measure signal $V_{VS1}$ or for the second voltage measure signal $V_{VS2}$). In this way, with contact-less sensors around the wire under test, the meter apparatus 100 is capable of determining the relevant AC signal parameters (namely, the amplitude of the AC current $I_{AC}$, the amplitude of the AC voltage $V_{AC}$ and the phase shift between the AC current $I_{AC}$ and the AC voltage $V_{AC}$) regardless of wire geometry (namely, without calibration).

As should be readily understood, as both the first $V_{VS1}$ and second $V_{VS2}$ voltage measure signals depend on the amplitude of the AC voltage $V_{AC}$ and on the capacitance value $C_S$, in principle either the equation for first voltage measure signal $V_{VS1}$ or the equation for the second voltage measure signal $V_{VS2}$ may be reversed for determining the amplitude of the AC voltage $V_{AC}$. In any case, in practical scenarios, the equation for the voltage measure signal to be reversed may be chosen according to the actual implementation of the conditioning module and/or according to design options and/or criteria (for example, the equation for the voltage measure signal implying lower computational capability may be reversed).

Back to FIG. 2A, the conditioning module $\mathbf{115}_C$' preferably comprises one or more voltage stabilizing elements for stabilizing the voltages during their conditioning (so as to make the first $V_{VS1}$ and/or second $V_{VS2}$ voltage measure signals as precise as possible). In the exemplary, not limiting, illustrated embodiment, one voltage stabilizing element for each sub-branch is provided. Preferably, each voltage stabilizing element comprises a respective operational amplifier $OA_3$-$OA_6$ in buffer configuration (hereinafter referred to as voltage buffer for the sake of conciseness).

Even more preferably, the voltage buffer $OA_3$ electrically couples the first terminal $T_{1C3}$ of the first input capacitor $C_3$ to the first terminal $T_{1R3}$ of the resistor $R_3$, the voltage buffer $OA_4$ electrically couples the first terminal $T_{1R2}$ of the first input resistor $R_2$ to the first terminal $T_{1R9}$ of the resistor $R_9$, the voltage buffer $OA_5$ electrically couples the first terminal $T_{1C4}$ of the second input capacitor $C_4$ to the first terminal $T_{1R5}$ of the resistor $R_5$, the voltage buffer $OA_6$ electrically couples the first terminal $T_{1R8}$ of the second input resistor $R_8$ to the first terminal $T_{1R11}$ of the resistor $R_{11}$. Thanks to the use of the voltage buffers $OA_3$-$OA_6$ as voltage stabilizing elements, no phase shift is added (thus avoiding a greater burden of computational efforts for determining the AC signal parameters).

With reference now to FIG. 2B, a circuit representation of a conditioning module 115$_C$" according to a second embodiment of the present invention is shown.

The conditioning module 115$_C$" is almost entirely similar to the conditioning module 115$_C$', for which reason same elements will not be discussed again.

The conditioning module 115$_C$" differs from the conditioning module 115$_C$' in that the first and second input stages comprise, instead of the high-pass filter (defined by the first $C_1$ and second $C_2$ sensing capacitors and, respectively, the first $R_1$,$R_2$ and second $R_7$,$R_8$ input resistors, as discussed above), an impedance voltage divider for the AC voltage $V_{AC}$. In the example at issue wherein the voltage measurement section 115 is configured for providing the first $V_{VS1}$ and/or second $V_{VS2}$ voltage measure signals based on capacitive coupling with line L and neutral N wires, the impedance voltage divider is advantageously a capacitive voltage divider.

In the exemplary illustrated embodiment, the first input stage comprises a further first input capacitive element, e.g. a capacitor (hereinafter referred to as first input capacitor, for the sake of conciseness) $C_5$ electrically coupleable to the first sensing capacitor $C_1$ and, preferably, the second input stage comprises a further second input capacitive element, e.g. a capacitor (hereinafter referred to as second input capacitor, for the sake of conciseness) $C_6$ electrically coupleable to the second sensing capacitor $C_2$. In this way, the first $C_1$ and second $C_2$ sensing capacitors and, respectively, the first $C_5$ and second $C_6$ input capacitors define, when coupled to each other, an impedance voltage divider for the AC voltage $V_{AC}$ (i.e., a first capacitive voltage divider $C_1$,$C_5$ for the AC voltage $V_{AC}^+$ and a second capacitive voltage divider $C_2$,$C_6$ for the AC voltage $V_{AC}^-$).

Preferably, as illustrated, the first input capacitor $C_5$ has a first terminal $T_{1C5}$ electrically coupled to the second terminal $T_{2C1}$ of the first sensing capacitor $C_1$ when the switching device $SW_{115,A}$ is in the second configuration (the first terminal $T_{1C5}$ of the first input capacitor $C_5$ being for example electrically floating when the switching device $SW_{115,A}$ is in the first configuration) and to the resistor $R_9$ (for example, by interposition of the voltage buffer $OA_4$), and a second terminal $T_{1C5}$ electrically coupled (e.g., directly connected) to the ground terminal. Similarly, the second input capacitor $C_6$ has a first terminal $T_{1C6}$ electrically coupled to the second terminal $T_{2C2}$ of the second sensing capacitor $C_2$ when the switching device $SW_{115,A}$ is in the second configuration (the first terminal $T_{1C6}$ of the second input capacitor $C_6$ being for example electrically floating when the switching device $SW_{115,A}$ is in the first configuration) and to the resistor $R_{11}$ (for example, by interposition of the voltage buffer $OA_6$), and a second terminal $T_{2C6}$ electrically coupled to the ground terminal.

Assuming, as discussed above, a same capacitance value $C_S$ for both the first $C_1$ and second $C_2$ sensing capacitors, and assuming a same capacitance value $C_{IN}$ for both the first $C_5$ and second $C_6$ input capacitors (the capacitance value $C_{IN}$ being preferably chosen according to the smallest value of the AC voltage $V_{AC}$ that the conditioning module 115$_C$" is required to discern, i.e. for maximizing the span and optimizing the accuracy, and/or according to the full scale range at which the ADC module of the control unit 120 is allowed to operate), the voltage at the first terminal $T_{1C5}$ of the first input capacitor $C_S$ (denoted by $V_{IC5}$) and the voltage at the first terminal $T_{1C6}$ of the second input capacitor $C_6$ (denoted by $V_{IC6}$) are:

$$V_{1C5} = \frac{C_S}{(C_S + C_{IN})} V_{AC}^+$$

$$V_{1C6} = \frac{C_S}{(C_S + C_{IN})} V_{AC}^-$$

Assuming, as illustrated, that the second output stage has the same circuit implementation of the previous embodiment, then the second voltage measure signal $V_{VS2}$ resulting from the conditioning module 115$_C$" is (the resistance values of the resistors $R_9$, $R_{10}$, $R_{11}$ and $R_{12}$ being again denoted by $R_9$, $R_{10}$, $R_{11}$ and $R_{12}$, respectively):

$$V_{VS2} = V_{1C5}\frac{R_{10}}{R_9 + R_{10}}\frac{R_{11}}{R_{11} + R_{12}} - V_{1C6}\frac{R_{12}}{R_{11}} == \frac{C_S}{(C_S + C_{IN})}\left(V_{AC}^+\frac{R_{10}}{R_9 + R_{10}}\frac{R_{11}}{R_{11} + R_{12}} - V_{AC}^-\frac{R_{12}}{R_{11}}\right)$$

Moreover, assuming, similarly to the above discussion, that the structure (as well as the values and the electrical properties of electronic components) of the differential amplifier circuit of the second output stage is preferably identical to the structure (and, respectively, to the values and the electrical properties of electronic components) of the differential amplifier circuit of the first output stage (or substantially identical, as the possibility of including structural differences, e.g. for taking into account manufacturing tolerances or non-idealities of specific electronic components, is not excluded), the first voltage measure signal $V_{VS1}$ is (the resistance values of the resistors $R_3$, $R_4$, $R_5$ and $R_6$ being denoted by $R_3$, $R_4$, $R_5$ and $R_6$, respectively):

$$V_{VS1} = V_{1C3}\frac{R_4}{R_3 + R_4}\frac{R_5}{R_5 + R_6} - V_{1C4}\frac{R_6}{R_5} == \frac{C_S}{C_S + C_I}\left(V_{AC}^+\frac{R_4}{R_3 + R_4}\frac{R_5}{R_5 + R_6} - V_{AC}^-\frac{R_6}{R_5}\right)$$

The above assumption implies that:

$$\left(V_{AC}^+\frac{R_{10}}{R_9 + R_{10}}\frac{R_{11}}{R_{11} + R_{12}} - V_{AC}^-\frac{R_{12}}{R_{11}}\right) = \left(V_{AC}^+\frac{R_4}{R_3 + R_4}\frac{R_5}{R_5 + R_6} - V_{AC}^-\frac{R_6}{R_5}\right)$$

In the considered embodiment, thanks to the impedance voltage divider, the second voltage measure signal $V_{VS2}$ is in phase (i.e., it has no, or substantially no, phase shift) with respect to the first voltage measure signal $V_{VS1}$, so that the capacitance value $C_S$ can be easily determined based on the first $V_{VS1}$ and second $V_{VS2}$ voltage measure signals (i.e., based on the amplitudes thereof as detected by the control unit 120, as discussed herebelow). In any case, similarly to the above discussion, the provision of predetermined phase shifts to the first voltage measure signal $V_{VS1}$ and/or to the second voltage measure signal $V_{VS2}$, and/or to the current measure signal $V_{IS}$ does not affect the principles of the present invention.

More particularly, in the considered embodiment and under the above assumptions, upon reception of the first $V_{VS1}$ and second $V_{VS2}$ voltage measure signals, the control unit 120 is configured for determining the capacitance value $C_S$ according to a difference between the first $V_{VS1}$ and second $V_{VS2}$ voltage measure signals (i.e., according to the amplitudes thereof detected by the control unit 120), e.g. by reversing the above equation for the first $V_{VS1}$ and second $V_{VS2}$ voltage measure signals as follows:

$$C_S = \frac{V_{VS1}C_I - V_{VS2}C_{IN}}{V_{VS1} - V_{VS2}}$$

and hence for determining the amplitude of the AC voltage $V_{AC}$ according to the first voltage measure signal $V_{VS1}$ or to the second voltage measure signal $V_{VS2}$ (i.e., according to the amplitudes thereof as detected by the control unit 120), and to the capacitance value $C_S$ (e.g., by reversing the above equation for the first voltage measure signal $V_{VS1}$ or the above equation for the second voltage measure signal $V_{VS2}$, as discussed above).

As should be readily understood from the above equation of the capacitance value $C_S$, in the considered example of symmetrical structure of the first and second conditioning branches, the capacitance values $C_I$ and $C_{IN}$ are advantageously set different from each other (in order to avoid numerator zeroing and, hence, the impossibility of determining the capacitance value $C_S$ itself).

In this way, the meter apparatus 100 is capable of determining the relevant AC signal parameters (namely, the amplitude of the AC current $I_{AC}$, the amplitude of the AC voltage $V_{AC}$ and the phase shift between the AC current $I_{AC}$ and the AC voltage $V_{AC}$) regardless of the size of the wires (namely, without calibration because of the size of the wires).

Moreover, with respect to the previous embodiment, the conditioning module 115$_C$" allows avoiding the determination of the phase shift between the first $V_{VS1}$ and second $V_{VS2}$ voltage measure signals, which could be a relevant source of error in some applications.

With reference now to FIG. 2C, it shows a circuit representation of a conditioning module 115$_C$''' according to a third embodiment of the present invention.

The conditioning module 115$_C$''' is almost entirely similar to the conditioning module 115$_C$', for which reason same elements will not be discussed again.

The conditioning module 115$_C$''' differs from the conditioning module 115$_C$' in that it comprises, instead of the high-pass filter (which, in the conditioning module 115$_C$', is defined by the first $C_1$ and second $C_2$ sensing capacitors and, respectively, the first $R_1$,$R_2$ and second $R_7$,$R_8$ input resistors, as discussed above), a differentiator arrangement for the AC voltage $V_{AC}$.

In the exemplary illustrated embodiment, the first and second input stages comprise first $R_{13}$ and second $R_{14}$ input resistors electrically coupleable to the first $C_1$ and second $C_2$ sensing capacitors, respectively, and first $OA_7$ and second $OA_8$ operational amplifiers electrically coupled to the first $R_{13}$ and second $R_{14}$ input resistors, respectively (the operational amplifiers $OA_7$,$OA_8$ preferably having same electrical characteristics, for example the same electrical characteristics as the operational amplifiers $OA_1$-$OA_6$ and being preferably powered with the supply voltages $V_{SUPPLY}$ upon closing of the switching device $SW_{115,B}$).

Preferably, as visible in the figure, the first input resistor $R_{13}$ has a first terminal $T_{1R13}$ electrically coupled (e.g., electrically connected) to the second terminal $T_{2C1}$ of the first sensing capacitor $C_1$ when the switching device $SW_{115,A}$ is in the second configuration (the first terminal $T_{1R13}$ of the first input resistor $R_{13}$ being for example electrically floating when the switching device $SW_{115,A}$ is in the first configuration) and electrically coupled (e.g., electrically connected) to a an inverting input terminal of the first operational amplifier $OA_7$, and a second terminal $T_{2R13}$ electrically coupled (e.g., electrically connected) to an output terminal of the first operational amplifier $OA_7$ and electrically coupled to the first terminal $T_{1R9}$ of the resistor $R_9$ (for example, by interposition of the voltage buffer $OA_4$). In other words, the first input resistor $R_{13}$ is electrically coupled (e.g., electrically connected) across the (inverting) input terminal and the output terminal of the first operational amplifier $OA_7$ (with the non-inverting input terminal of the first operational amplifier $OA_7$ that is instead electrically coupled, e.g. electrically connected, to the ground terminal).

Preferably, as visible in the figure, the second input resistor $R_{14}$ has a first terminal $T_{1R14}$ electrically coupled (e.g., electrically connected) to the second terminal $T_{2C2}$ of the second sensing capacitor $C_2$ when the switching device $SW_{115,A}$ is in the second configuration (the first terminal $T_{1R14}$ of the second input resistor $R_{14}$ being for example electrically floating when the switching device $SW_{115,A}$ is in the first configuration) and electrically coupled (e.g., electrically connected) to a an inverting input terminal of the first operational amplifier $OA_8$, and a second terminal $T_{2R14}$ electrically coupled (e.g., electrically connected) to an output terminal of the second operational amplifier $OA_8$ and electrically coupled to the first terminal $T_{1R11}$ of the resistor $R_{11}$ (for example, by interposition of the voltage buffer $OA_6$). In other words, the second input resistor $R_{14}$ is electrically coupled (e.g., electrically connected) across the (inverting) input terminal and the output terminal of the second operational amplifier $OA_8$ (with the non-inverting input terminal of the second operational amplifier $OA_8$ that is instead electrically coupled, e.g. electrically connected, to the ground terminal).

Thus, when the switching device $SW_{115,A}$ is in the second configuration, the first sensing capacitor $C_1$, the first input resistor $R_{13}$ and the first operational amplifier $OA_7$ define a differentiator arrangement (or differentiator) for the AC voltage $V_{AC}^+$, whereas the second sensing capacitor $C_2$, the second input resistor $R_{14}$ and the second operational amplifier $OA_8$ define a differentiator for the AC voltage $V_{AC}^-$ (or, otherwise stated, the first $C_1$ and second $C_2$ sensing capacitors and, respectively, the first $R_{13}$ and second $R_{14}$ input resistors and the associated first $OA_7$ and second $OA_8$ operational amplifiers, when electrically coupled to each other, define as a whole a differentiator for the AC voltage $V_{AC}$). In any case, as should be readily understood, circuit arrangements other than those formed by the operational amplifiers $OA_7$, $OA_8$ and the input resistors $R_{13}$,$R_{14}$ can be used to for implementing the differentiator.

Assuming, as discussed above, a same capacitance value $C_S$ for both the first $C_1$ and second $C_2$ sensing capacitors, and assuming a same resistance value $R_{IN}$ for both the first $R_{13}$ and second $R_{14}$ input resistors (the resistance value $R_{IN}$ being preferably chosen according to the smallest value of the AC voltage $V_{AC}$ that the conditioning module $\mathbf{115}_C$ is required to discern, i.e. for maximizing the span and optimizing the accuracy, and/or according to the full scale range at which the ADC module of the control unit 120 is allowed to operate), the voltage at the second terminal $T_{2R13}$ of the first input resistor $R_{13}$ (denoted by $V_{2R13}$), and hence at the output terminal of the first operational amplifier $OA_7$, and the voltage at the second terminal $T_{2R14}$ of the second input resistor $R_{14}$ (denoted by $V_{2R14}$), and hence at the output terminal of the second operational amplifier $OA_8$, are:

$$V_{2R13} = -R_{IN} C_S \frac{dV_{AC}^{+}}{dt}$$

$$V_{2R14} = -R_{IN} C_S \frac{dV_{AC}^{-}}{dt}$$

Assuming, as illustrated, that the second output stage has the same circuit implementation of the previous embodiment, then the second voltage measure signal $V_{VS2}$ resulting from the conditioning module $\mathbf{115}_C$''' is (the resistance values of the resistors $R_9$, $R_{10}$, $R_{11}$ and $R_{12}$ being again denoted by $R_9$, $R_{10}$, $R_{11}$ and $R_{12}$, respectively):

$$V_{VS2} = V_{2R13} \frac{R_{10}}{R_9 + R_{10}} \frac{R_{11}}{R_{11} + R_{12}} - V_{2R14} \frac{R_{12}}{R_{11}} == -R_{IN} C_S \left( \frac{dV_{AC}^{+}}{dt} \frac{R_{10}}{R_9 + R_{10}} \frac{R_{11}}{R_{11} + R_{12}} - \frac{dV_{AC}^{-}}{dt} \frac{R_{12}}{R_{11}} \right)$$

Moreover, assuming that the AC voltage $V_{AC}$ is in the form:

$$V_{AC} = A \sin(2\pi ft)$$

wherein A is the amplitude of the AC voltage $V_{AC}$ to be determined, then the second voltage measure signal $V_{VS2}$ resulting from the conditioning module $\mathbf{115}_C$''' is:

$$V_{VS2} = -R_{IN} C_S \; A \; 2\pi f \cos(2\pi ft) \left( \frac{R_{10}}{R_9 + R_{10}} \frac{R_{11}}{R_{11} + R_{12}} - \frac{R_{12}}{R_{11}} \right)$$

In addition, assuming, similarly to the above discussion, that the structure (as well as the values and the electrical properties of electronic components) of the differential amplifier circuit of the second output stage is preferably identical to the structure (and, respectively, to the values and the electrical properties of electronic components) of the differential amplifier circuit of the first output stage (or substantially identical, as the possibility of including structural differences, e.g. for taking into account manufacturing tolerances or non-idealities of specific electronic components, is not excluded), the first voltage measure signal $V_{VS1}$ is (the resistance values of the resistors $R_3$, $R_4$, $R_5$ and $R_6$ being denoted by $R_3$, $R_4$, $R_5$ and $R_6$, respectively):

$$V_{VS1} = V_{1C3} \frac{R_4}{R_3 + R_4} \frac{R_5}{R_5 + R_6} - V_{1C4} \frac{R_6}{R_5} == \frac{C_S}{C_S + C_I} A \; (\sin(2\pi ft) \left( \frac{R_4}{R_3 + R_4} \frac{R_5}{R_5 + R_6} - \frac{R_6}{R_5} \right) ==$$

-continued $$\frac{C_S}{C_S + C_I} A \; (\sin(2\pi ft) \left( \frac{R_{10}}{R_9 + R_{10}} \frac{R_{11}}{R_{11} + R_{12}} - \frac{R_{12}}{R_{11}} \right)$$

Thus, from the equation above it follows that $$V_{VS1} = \frac{C_S}{C_S + C_I} A \; (\sin(2\pi ft) \left( \frac{V_{VS2}}{R_{IN} C_S \; A \; 2\pi f \; \cos(2\pi ft)} \right)$$

In the considered embodiment, the capacitance value $C_S$ can be easily determined based on the first $V_{VS1}$ and second $V_{VS2}$ voltage measure signals (i.e., based on the amplitudes thereof as detected by the control unit 120) from the above equations.

More particularly, in the considered embodiment and under the above assumptions, upon reception of the first $V_{VS1}$ and second $V_{VS2}$ voltage measure signals, the control unit 120 is configured for determining the capacitance value $C_S$ according to a difference between the first $V_{VS1}$ and second $V_{VS2}$ voltage measure signals, e.g. by reversing the above equation for the first $V_{VS1}$ and second $V_{VS2}$ voltage measure signals as follows:

$$C_S = \frac{V_{VS2} \; \sin(2\pi ft) - C_I V_{VS1} R_{IN} 2\pi f \; (2\pi ft)}{V_{VS1} R_{IN} 2\pi f \; \cos(2\pi ft)}$$

and hence for determining the amplitude A of the AC voltage $V_{AC}$ according to the first voltage measure signal $V_{VS1}$ or the second voltage measure signal $V_{VS2}$, and to the capacitance value $C_S$ (e.g., by reversing the above equation for the first voltage measure signal $V_{VS1}$ or the above equation for the second voltage measure signal $V_{VS2}$, as discussed above), as follows:

$$A = \frac{\frac{C_S}{C_S + C_I} \sin(2\pi ft) \; C_S 2\pi f \; \cos(2\pi ft)}{C_S 2\pi f \; \cos(2\pi ft) \; \sin(2\pi ft) + 2\pi f \; C_S R_{IN} \cos(2\pi ft) \frac{C_S}{C_S + C_I} \sin(2\pi ft)}$$

As should be readily understood, the amplitude A of the AC voltage $V_{AC}$ is advantageously determined by taking into account a number of samples, the samples being preferably sufficiently far from the "risky" points in which the above equation is not valid (e.g., π/6, π/4, π/3 and kπ/20).

In this way, the meter apparatus 100 is capable of determining the relevant AC signal parameters (namely, the amplitude of the AC current $I_{AC}$, the amplitude of the AC voltage $V_{AC}$ and the phase shift between the AC current $I_{AC}$ and the AC voltage $V_{AC}$) regardless of the size of the wires (namely, without calibration because of the size of the wires).

Moreover, with respect to the first embodiment, the conditioning module $\mathbf{115}_C$''' allows avoiding the determination of the phase shift between the first $V_{VS1}$ and second $V_{VS2}$ voltage measure signals, which could be a relevant source of error in some applications. In particular, this approach significantly improves the amplitude measurement with an error lower than 5%.

In addition, with respect to the conditioning module $\mathbf{115}_C$'', wherein the ADC module should exhibit a very high sensitivity (i.e., a resolution of the order of μV) thus determining relatively high complexity and costs, the conditioning module 115$_C$''' allows achieving very low costs and reliability.

Naturally, in order to satisfy local and specific requirements, a person skilled in the art may apply to the solution described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

The invention claimed is:

1. A meter apparatus for determining parameters of an AC electric signal in first and second wires, the AC electric signal comprising an AC electric current and an AC electric voltage, the meter apparatus comprising:

a measurement circuit configured to provide first and second measure signals each one indicative of the AC electric voltage based on a first capacitive coupling between the measurement circuit and the first wire and on a second capacitive coupling between the measurement circuit and the second wire that is independent from the first capacitive coupling, the first and second measure signals depending on capacitance values of the first and second capacitive couplings;

a controller configured to:

determine said capacitance values of the first and second capacitive couplings according to the first and second measure signals, and determine an amplitude of the AC electric voltage according to the first or second measure signal, and to the capacitance values of the first and second capacitive couplings; and first and second capacitive elements configured to perform said first and second capacitive couplings, wherein said first and second capacitive elements comprise at least a portion of said first and second wires, and wherein said measurement circuit further comprises first and second input capacitive elements electrically coupleable to the first and second capacitive elements, respectively, the first and second capacitive elements and, respectively, the first and second input capacitive elements defining, when coupled to each other, an impedance voltage divider providing said first measure signal from said AC electric voltage, the first measure signal being in phase with respect to said AC electric voltage.

2. The meter apparatus according to claim 1, wherein the measurement circuit is further configured to provide a third measure signal indicative of the AC electric current based on an inductive coupling with the first or second wire, the controller being further configured to determine a phase shift between the AC electric voltage and the AC electric current according to a phase shift between the first and third measure signals.

3. The meter apparatus according to claim 1, wherein said measurement circuit further comprises further first and further second capacitive elements electrically coupleable to the first and second capacitive elements, respectively, the first and second capacitive elements and, respectively, the further first and further second capacitive elements defining, when coupled to each other, an impedance voltage divider providing said second measure signal from said AC electric voltage, the first and second measure signals being in phase with respect to each other.

4. The meter apparatus according to claim 1, wherein said measurement circuit further comprises first and second circuit arrangements electrically coupleable to the first and second capacitive elements, respectively, the first and second capacitive elements and, respectively, the first and second circuit arrangements defining, when coupled to each other, a differentiator arrangement providing said second measure signal from said AC electric voltage.

5. The meter apparatus according to claim 3, wherein the controller is further configured to determine said capacitance values of the first and second capacitive couplings according to amplitudes of the first and second measure signals, and to determine the amplitude of the AC electric voltage according to the amplitudes of first or second measure signal and to the capacitance values of the first and second capacitive couplings.

6. The meter apparatus according to claim 1, wherein the first and second measure signals have a phase shift with respect to each other, said phase shift between the first and second measure signals depending on the capacitance values of the first and second capacitive couplings, and wherein the controller is further configured to:

determine said phase shift between the first and second measure signals, determine said capacitance values of the first and second capacitive couplings according to said phase shift between the first and second measure signals, and determine the amplitude of the AC electric voltage according to the first or second measure signal, and to the capacitance values of the first and second capacitive couplings.

7. The meter apparatus according to claim 6, wherein said measurement circuit further comprises first and second resistive elements electrically coupleable to the first and second capacitive elements, respectively, the first and second capacitive elements and, respectively, the first and second resistive elements defining, when coupled to each other, a high-pass filter providing said second measure signal from said AC electric voltage.

8. The meter apparatus according to claim 2, wherein the measurement circuit further comprises an energy harvester configured to harvest energy from said inductive coupling, and a switching device selectively operable in a first configuration allowing energy harvesting by said energy harvester or in a second configuration allowing provision of the third measure signal and preventing said energy harvesting.

9. The meter apparatus according to claim 8, wherein the measurement circuit further comprises a charge storage element configured to store electric charge according to said energy harvesting and to supply said electric charge to the measurement circuit, to the measurement circuit, and to the controller.

10. The meter apparatus according to claim 2, wherein the measurement circuit further comprises a current clamp device configured to perform said inductive coupling with the first or second wires.

11. The meter apparatus according to claim 10, wherein the current clamp device comprises a split core current transformer.

12. The meter apparatus according to claim 1, wherein said measurement circuit further comprises first and second electrically conductive layers configured to be provided on portions of the first and second wires, respectively, and wherein a portion of the first wire and the first electrically conductive layer thereon define said first capacitive element between the first wire and the measurement circuit, and a portion of the second wire and the second electrically conductive layer thereon define said second capacitive element between the second wire and the measurement circuit.

13. A method for determining parameters of an AC electric signal in first and second wires, the AC electric signal comprising an AC electric current and an AC electric voltage, the method comprising:

providing first and second measure signals each one indicative of the AC electric voltage based on a first capacitive coupling between a measurement circuit and the first wire and on a second capacitive coupling between the measurement circuit and the second wire that is independent from the first capacitive coupling, the first and second measure signals depending on capacitance values of the first and second capacitive couplings;

determining said capacitance values of the first and second capacitive couplings according to the first and second measure signals; and determining the amplitude of the AC electric voltage according to the first or second measure signal, and to the capacitance values of the first and second capacitive couplings;

providing first and second capacitive elements configured to perform said first and second capacitive couplings, wherein said first and second capacitive elements comprise at least a portion of said first and second wires, and wherein said measurement circuit further comprises first and second input capacitive elements electrically coupleable to the first and second capacitive elements, respectively, the first and second capacitive elements and, respectively, the first and second input capacitive elements defining, when coupled to each other, an impedance voltage divider providing said first measure signal from said AC electric voltage, the first measure signal being in phase with respect to said AC electric voltage.

* * * * *